(12) United States Patent
Kato

(10) Patent No.: US 8,835,813 B2
(45) Date of Patent: Sep. 16, 2014

(54) HEAT TREATMENT APPARATUS AND METHOD FOR HEATING SUBSTRATE BY LIGHT-IRRADIATION

(71) Applicant: Shinichi Kato, Kyoto (JP)

(72) Inventor: Shinichi Kato, Kyoto (JP)

(73) Assignee: Dainippon Screen Mfg. Co., Ltd (JP)

( * ) Notice: Subject to any disclaimer, the term of this patent is extended or adjusted under 35 U.S.C. 154(b) by 0 days.

(21) Appl. No.: 13/759,658

(22) Filed: Feb. 5, 2013

(65) Prior Publication Data

US 2013/0148948 A1 Jun. 13, 2013

Related U.S. Application Data

(62) Division of application No. 12/648,737, filed on Dec. 29, 2009, now Pat. No. 8,461,033.

(30) Foreign Application Priority Data

Jan. 13, 2009 (JP) .................. 2009-004406
Feb. 18, 2009 (JP) .................. 2009-035642

(51) Int. Cl.
*F27D 11/12* (2006.01)
*F27D 19/00* (2006.01)
*F27D 99/00* (2010.01)
*H01L 21/67* (2006.01)

(52) U.S. Cl.
CPC ............... *F27D 11/12* (2013.01); *F27D 19/00* (2013.01); *F27D 99/0006* (2013.01); *H01L 21/67248* (2013.01); *H01L 21/67115* (2013.01)
USPC ... 219/411; 219/405; 219/121.6; 219/121.61; 219/121.62; 219/121.83; 219/444.1; 219/448.11; 219/448.12; 118/724; 118/725; 118/50.1

(58) Field of Classification Search
CPC ................... H01L 21/67115; H01L 21/67248; F27D 11/12; F27D 19/00; F27D 99/0006
USPC .............. 118/50.1, 724, 725; 219/411, 121.6, 219/121.61, 121.62, 121.83, 405, 444.1, 219/448.11, 448.12; 392/407, 411, 418
See application file for complete search history.

(56) References Cited

U.S. PATENT DOCUMENTS

| 4,151,008 A | 4/1979 | Kirkpatrick |
| 6,911,705 B2 | 6/2005 | Nishinohara |

(Continued)

FOREIGN PATENT DOCUMENTS

| JP | H4-296834 | 10/1992 |
| JP | H9-051667 | 2/1997 |

(Continued)

OTHER PUBLICATIONS

Office Action issued by Japanese Patent Office on Sep. 17, 2013 in connection with corresponding Japanese Patent Application No. 2009-004406 with English Translation thereof.

(Continued)

*Primary Examiner* — Mary Wilczewski
(74) *Attorney, Agent, or Firm* — Ostrolenk Faber LLP

(57) ABSTRACT

A light-emission output of a flash lamp for performing a light-irradiation heat treatment on a substrate in which impurities are implanted is increased up to a target value L1 over a period of time from 1 to 100 milliseconds, is kept for 5 to 100 milliseconds within a fluctuation range of plus or minus 30% from the target value L1, and is then attenuated from the target value L1 to zero over a period of time from 1 to 100 milliseconds. That is, compared with conventional flash lamp annealing, the light-emission output of the flash lamp is increased more gradually, is kept to be constant for a certain period of time, and is then decreased more gradually. As a result, a total heat amount of a surface of the substrate increases compared with the conventional case, but a surface temperature thereof rises more gradually and then drops more gradually compared with the conventional case.

8 Claims, 21 Drawing Sheets

(56) References Cited

U.S. PATENT DOCUMENTS

| | | |
|---|---|---|
| 6,936,797 B2 | 8/2005 | Hosokawa |
| 6,951,996 B2 | 10/2005 | Titans et al. |
| 6,998,580 B2 | 2/2006 | Kusuda et al. |
| 7,381,928 B2 * | 6/2008 | Kusuda et al. ............... 219/411 |
| 8,041,198 B2 * | 10/2011 | Kiyama et al. ............... 392/418 |
| 8,293,661 B2 | 10/2012 | Yamazaki |
| 8,461,033 B2 * | 6/2013 | Kato ........................... 438/530 |
| 2003/0013280 A1 | 1/2003 | Yamanaka |
| 2005/0202656 A1 | 9/2005 | Ito et al. |
| 2005/0258162 A1 | 11/2005 | Kusuda et al. |
| 2007/0087492 A1 | 4/2007 | Yamanaka |
| 2009/0067823 A1 | 3/2009 | Kusuda |
| 2009/0103906 A1 * | 4/2009 | Kusuda ........................ 392/418 |
| 2009/0166351 A1 | 7/2009 | Yokomori |
| 2009/0285568 A1 * | 11/2009 | Kiyama et al. ............... 392/418 |
| 2009/0311840 A1 | 12/2009 | Onizawa |
| 2010/0178776 A1 | 7/2010 | Kato |
| 2011/0034015 A1 | 2/2011 | Yoshino |
| 2011/0121306 A1 | 5/2011 | Im et al. |
| 2011/0248278 A1 * | 10/2011 | Im et al. ......................... 257/66 |
| 2012/0008926 A1 | 1/2012 | Kusuda |
| 2012/0238110 A1 * | 9/2012 | Yokouchi ..................... 438/795 |
| 2013/0156409 A1 | 6/2013 | Yokomori |
| 2013/0224967 A1 | 8/2013 | Kusuda |

FOREIGN PATENT DOCUMENTS

| | | |
|---|---|---|
| JP | 2002-198322 | 7/2002 |
| JP | 2002-252174 | 9/2002 |
| JP | 2004-055821 | 2/2004 |
| JP | 2004-088052 | 3/2004 |
| JP | 2004-200204 | 7/2004 |
| JP | 2005-260203 | 9/2005 |
| JP | 2007-281318 | 10/2007 |
| JP | 2008-098640 | 4/2008 |
| JP | 2008-277599 | 11/2008 |
| JP | 2009-070948 | 4/2009 |
| JP | 2009-164201 | 7/2009 |
| JP | 2009-302373 | 12/2009 |

OTHER PUBLICATIONS

Office Action issued by Japanese Patent Office on Sep. 17, 2013 in connection with corresponding Japanese Patent Application No. 2009-035642 with English Translation thereof.

Office Action issued by Japanese Patent Office on Apr. 30, 2014 in connection with corresponding Japanese Patent Application No. 2009-004406 with English Translation thereof.

Office Action issued by Japanese Patent Office on Apr. 30, 2014 in connection with corresponding Japanese Patent Application No. 2009-035642 with English Translation thereof.

* cited by examiner

FIG. 1
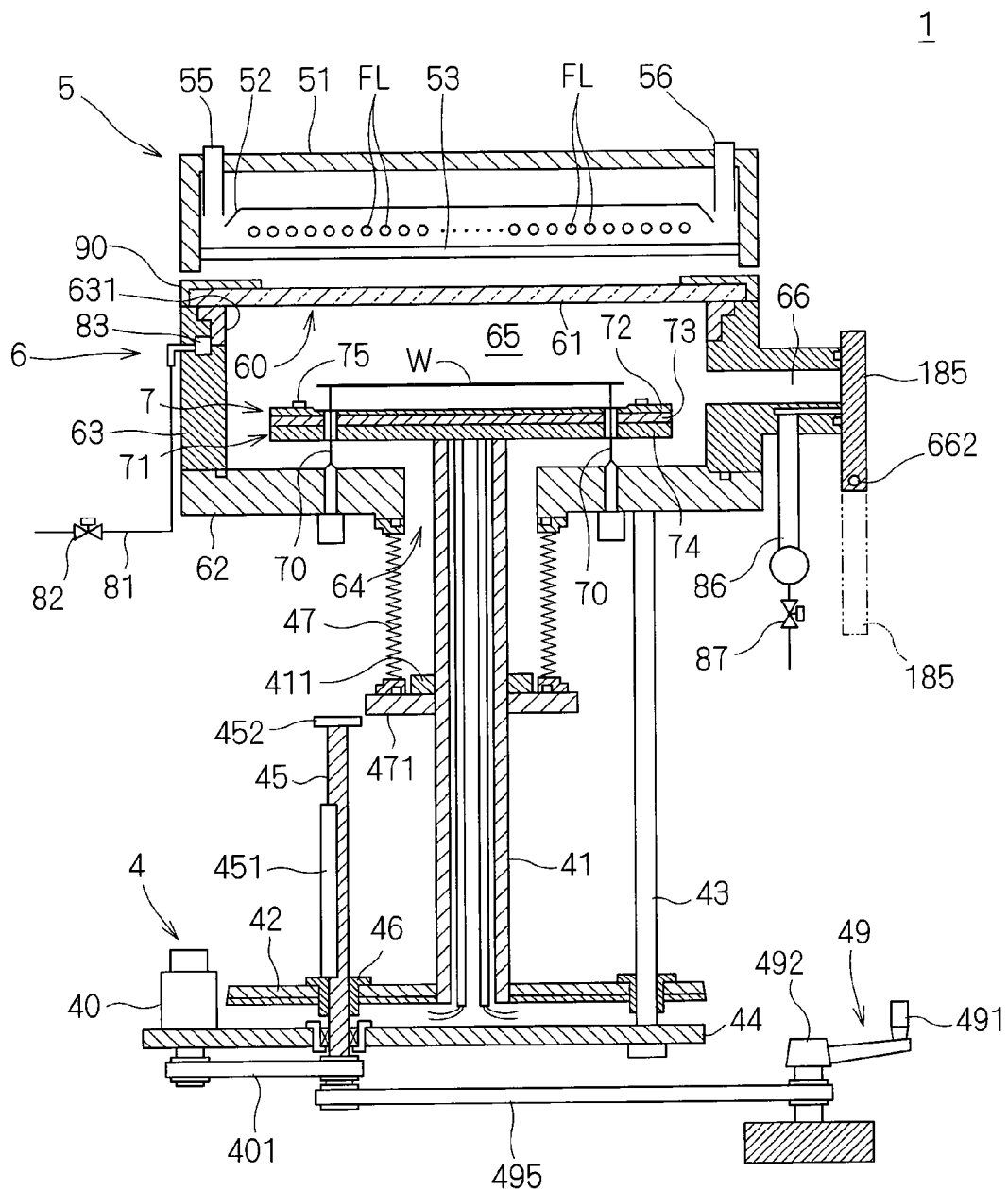

F I G . 2
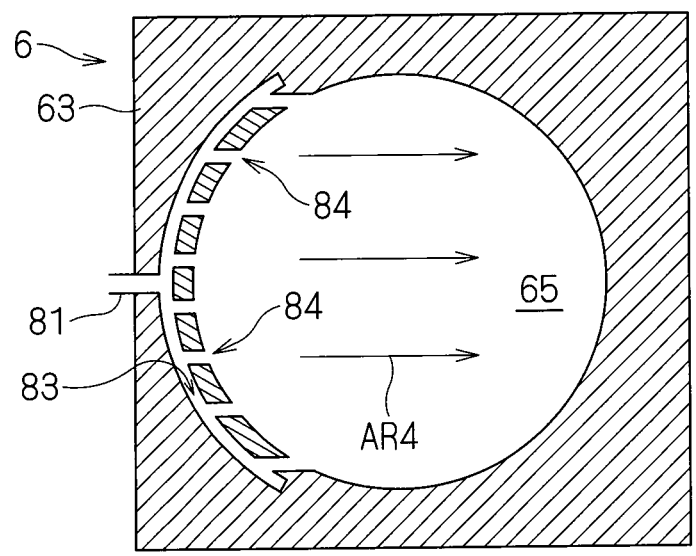

F I G . 3
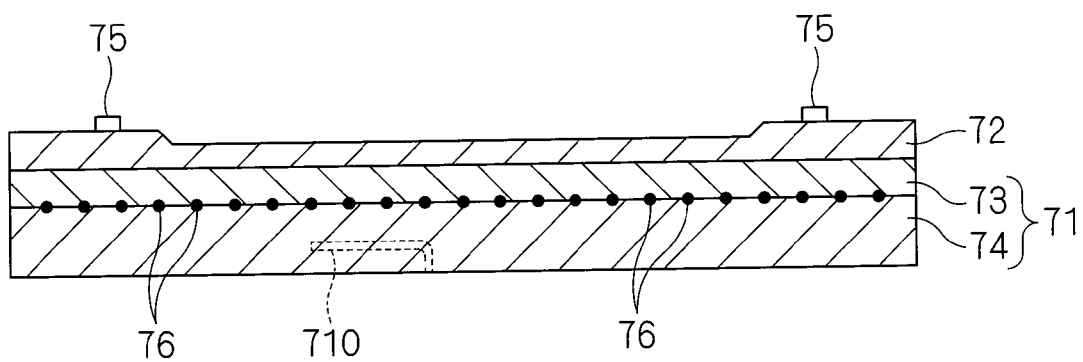

F I G. 4
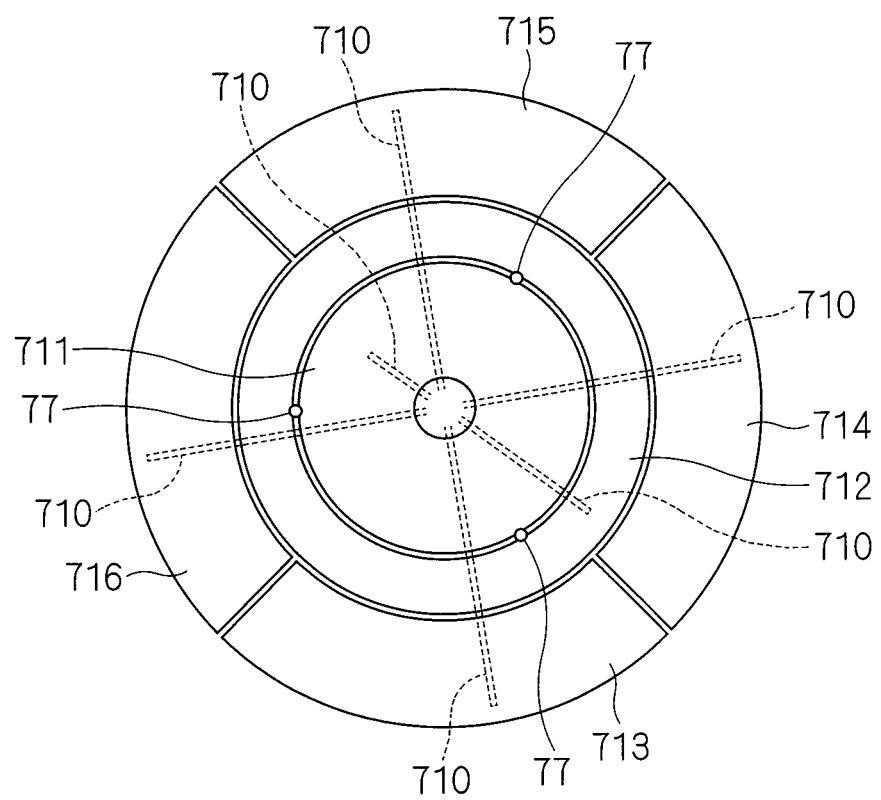

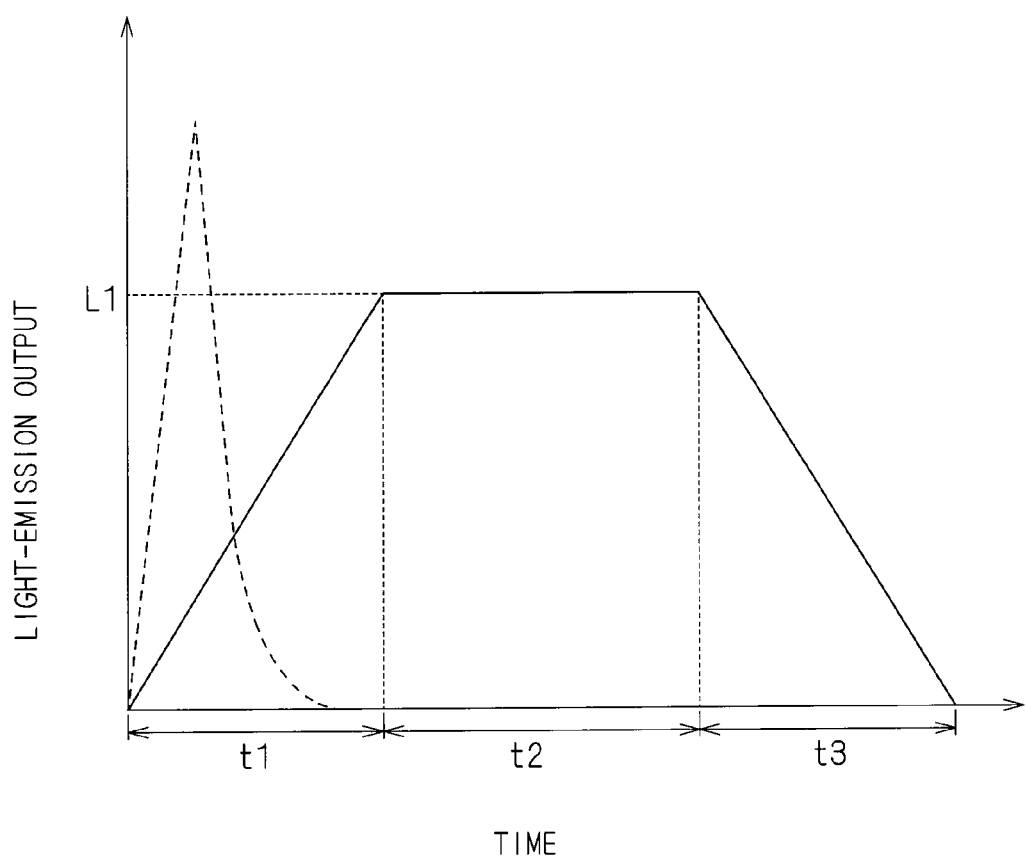
F I G . 1 1

F I G. 1 2
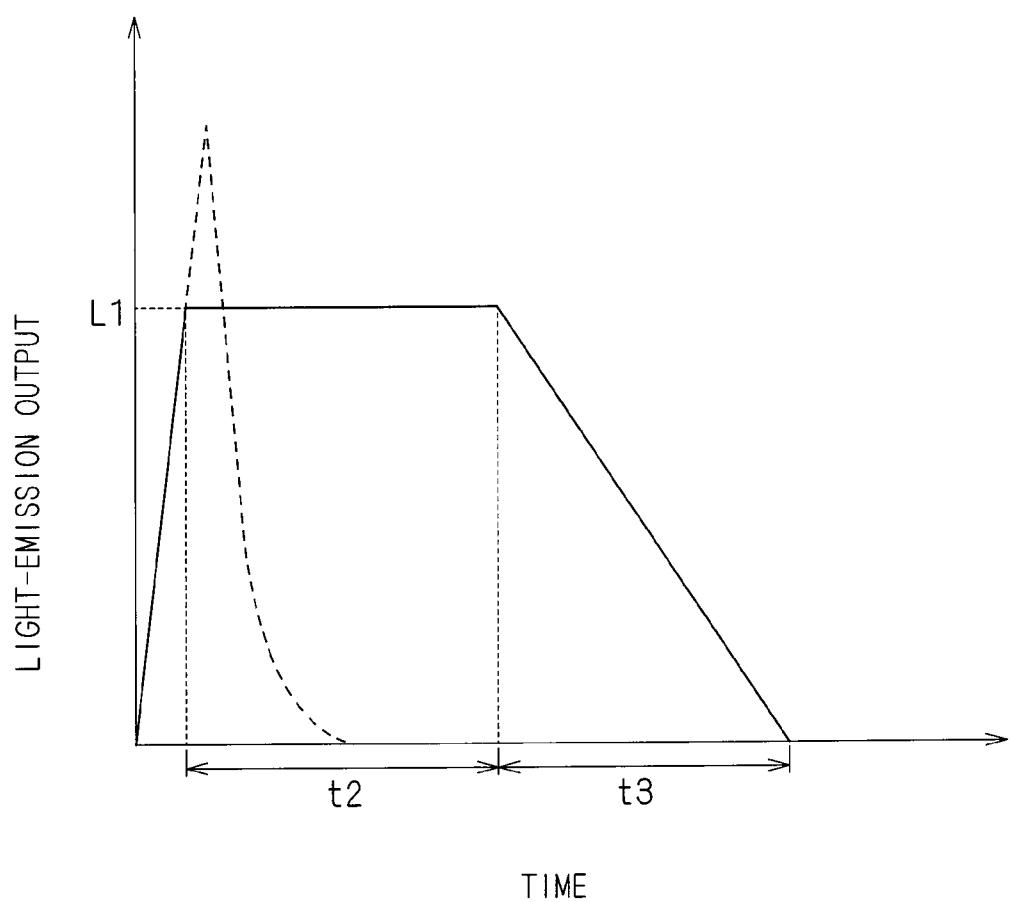

F I G . 1 3
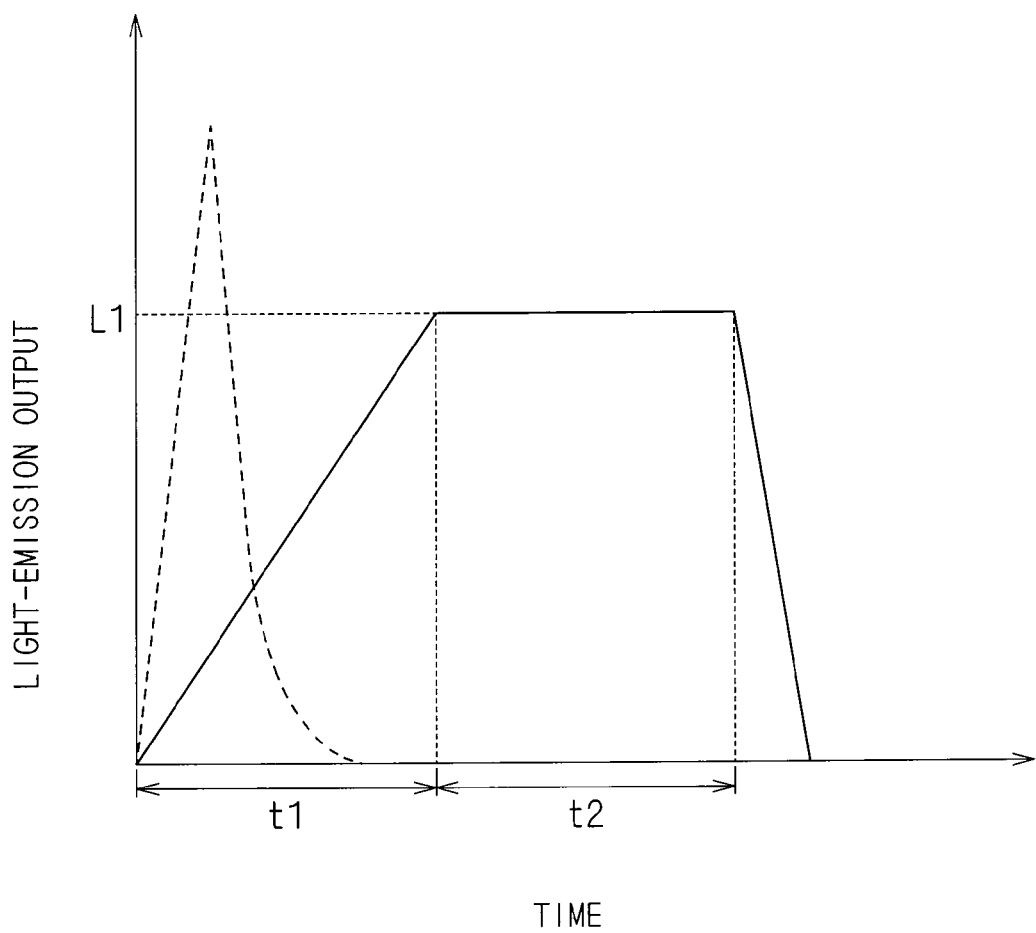

HEAT TREATMENT APPARATUS AND METHOD FOR HEATING SUBSTRATE BY LIGHT-IRRADIATION

CROSS REFERENCE TO RELATED APPLICATION

This application is a divisional of U.S. application Ser. No. 12/648,737, filed Dec. 29, 2009 entitled HEAT TREATMENT APPARATUS AND METHOD FOR HEATING SUBSTRATE BY LIGHT-IRRADIATION, which claims the benefit of Japanese Application No. 2009-004406, filed Jan. 13, 2009 and Japanese Application No. 2009-035642, filed Feb. 18, 2009, the contents of which are incorporated by this reference.

BACKGROUND OF THE INVENTION

1. Field of the Invention

The present invention relates to a heat treatment apparatus and a method for heating a substrate in which impurities are implanted, such as a semiconductor wafer and a glass substrate for a liquid crystal display apparatus (hereinafter referred to as simply as a "substrate"), by irradiating the substrate with light.

2. Description of the Background Art

In the manufacturing process for a semiconductor device, introduction of impurities is a required step for forming p-n junction in a semiconductor wafer. Currently, the introduction of impurities is generally performed by ion implantation and annealing performed thereafter. Ion implantation is a technique of ionizing elements of impurities such as boron (B), arsenic (As) and phosphorous (P) to collide with a semiconductor wafer at high acceleration voltage, to thereby physically implant impurities. The implanted impurities are activated by annealing treatment. In this case, if annealing time is not less than approximately several seconds, there is a fear that implanted impurities may be diffused deeply due to heat, whereby a junction depth becomes deep excessively, causing a problem in satisfactorily forming a device.

Therefore, an annealing method for heating a semiconductor wafer in an extremely short period of time is studied, and Japanese Patent Application Laid-Open No. 2007-281318 discloses activation of impurities implanted in a source/drain region using laser annealing (LSA). In addition, Japanese Patent Application Laid-Open No. 2008-98640 discloses activation of impurities through heating in a short period of time using flash lamp annealing (FLA).

Incidentally, a large number of defects are introduced into a silicon crystal of a semiconductor wafer as a result of implanting ions of high energy by ion implantation. Such defects tend to be introduced into a position which is slightly deeper than an ion implantation layer. In the case of performing annealing after the ion implantation, the introduced defects are desirably recovered also in conjunction with the activation of impurities.

However, in the case of performing heat treatment using laser annealing or flash lamp annealing for an extremely short period of time, for example, approximately several milliseconds, a temperature rise speed on a surface of a semiconductor wafer is faster than a speed at which heat is transmitted to an inside of the wafer due to heat conduction of silicon. Accordingly, though it is possible to raise temperature of an ion implantation layer, it is difficult to raise temperature sufficiently at a deep position into which defects are introduced. Naturally, when a semiconductor wafer is irradiated with light of extremely high energy, it is possible to raise temperature sufficiently at the deep position into which defects are introduced even by irradiation for an extremely short period of time, for example, approximately several milliseconds, to thereby recover the defects. However, surface temperature rises considerably to damage the semiconductor wafer, which leads to shattering of the semiconductor wafer in the worst case.

Moreover, in the case of performing annealing after the formation of a gate electrode, the gate electrode itself degrades by conventional irradiation for an extremely short period of time.

SUMMARY OF THE INVENTION

The present invention is directed to a heat treatment method for heating a substrate in which impurities are implanted to activate the impurities.

According to an aspect of the present invention, the heat treatment method includes: an impurity implanting step of implanting impurities in a given region of a semiconductor element formed on a substrate; and a light-irradiation step of performing light-irradiation and heating of a surface of the substrate including the given region for 10 to 1,000 milliseconds.

Accordingly, a total heat amount of the surface of the substrate increases but a surface temperature thereof gradually rises and then gradually drops, which enables activation of the implanted impurities and recovery of introduced defects while reducing damage to the substrate.

Preferably, the light-irradiation step includes: an output increasing step of increasing a light-emission output up to a target value over a period of time from 1 to 100 milliseconds; a constant output irradiation step, subsequent to the output increasing step, of keeping the light-emission output for 5 to 100 milliseconds within a fluctuation range of plus or minus 30% from the target value; and an output attenuating step, subsequent to the constant output irradiation step, of attenuating the light-emission output over a period of time from 1 to 100 milliseconds.

This is suitable for a case where light-irradiation is performed on a substrate in which a gate electrode of metal is formed.

Preferably, the light-irradiation step includes: an output increasing step of increasing a light-emission output up to a target value over a period of time not more than five milliseconds; and an output attenuating step, subsequent to the output increasing step, of attenuating the light-emission output over a period of time from 1 to 100 milliseconds.

This is suitable for a case where light-irradiation is performed on a substrate in which a gate electrode of polysilicon is formed.

Further, the present invention is directed to a heat treatment method for heating a substrate by irradiating the substrate with light.

According to another aspect of the present invention, the heat treatment method includes: a first light-irradiation step of performing light-irradiation of a substrate with a first light-emission output being as a target value; a second light-irradiation step, subsequent to the first light-irradiation step, of performing light-irradiation of the substrate in accordance with an output waveform that peaks at a second light-emission output that is higher than the first light-emission output and a maximum value of the light-emission output in the first light-irradiation step; and a third light-irradiation step, after the peak, of performing additional light-irradiation of the substrate with a light-emission output lower than the second light-emission output, wherein a total of a light-irradiation time in the first light-irradiation step, a light-irradiation time in the second light-irradiation step, and a light-irradiation time in the third light-irradiation step is not more than one second.

The light-irradiation in accordance with the waveform having the peak in the second light-irradiation step is performed on the substrate preheated to some extent in the first light-irradiation step, whereby it is possible to effectively activate the implanted impurities while reducing damage to the substrate by reducing a range of temperature rise when the surface temperature of the substrate instantaneously rises in the second light-irradiation step. In addition, the surface temperature of the substrate is decreased over a certain period of time in the third light-irradiation step of performing additional light-irradiation, whereby it is also possible to recover the defects introduced into the substrate.

Still further, the present invention is directed to a heat treatment apparatus for heating a substrate by irradiating the substrate with light.

According to still another aspect of the present invention, the heat treatment apparatus includes: a holder that holds a substrate; a light-irradiation unit that irradiates the substrate held by the holder with light; and a light-emission control unit that controls a light-emission output of the light-irradiation unit, the light-emission control unit being configured to control the light-emission output of the light-irradiation unit so that a total light-irradiation time is not more than one second and that a first light-irradiation of the substrate is performed with a first light-emission output being as a target value, then a second light-irradiation of the substrate is performed in accordance with an output waveform that peaks at a second light-emission output that is higher than the first light-emission output and a maximum value of the light-emission output of the first light-irradiation, and further an additional third light-irradiation of the substrate is performed, after the peak, with a light-emission output that is lower than the second light-emission output.

The second light-irradiation is performed in accordance with the waveform having a peak on the substrate preheated to some extent by the first light-irradiation, whereby it is possible to effectively activate the implanted impurities while reducing damage to the substrate by reducing a range of temperature rise when the surface temperature of the substrate instantaneously rises in the second light-irradiation. In addition, the surface temperature of the substrate is decreased over a certain period of time by the third light-irradiation of performing additional light-irradiation, which also enables recovery of the defects introduced into the substrate.

An object of the present invention is therefore to activate the implanted impurities and recover the introduced defects while reducing damage to the substrate.

These and other objects, features, aspects and advantages of the invention will become more apparent from the following detailed description of the invention when taken in conjunction with the accompanying drawings.

BRIEF DESCRIPTION OF THE DRAWING

FIG. 1 is a longitudinal cross-sectional view illustrating a configuration of a heat treatment apparatus suitable for performing a heat treatment method according to the present invention.

FIG. 2 is a cross-sectional view of a gas passage of the heat treatment apparatus in FIG. 1.

FIG. 3 is a cross-sectional view illustrating a structure of a holder.

FIG. 4 is a plan view of a hot plate.

FIG. 11 shows an example of a profile of a light-emission output of the flash lamp.

FIG. 12 shows another example of the profile of the light-emission output of the flash lamp.

FIG. 13 shows another example of the profile of the light-emission output of the flash lamp.

DESCRIPTION OF THE PREFERRED EMBODIMENTS

Figure 5:
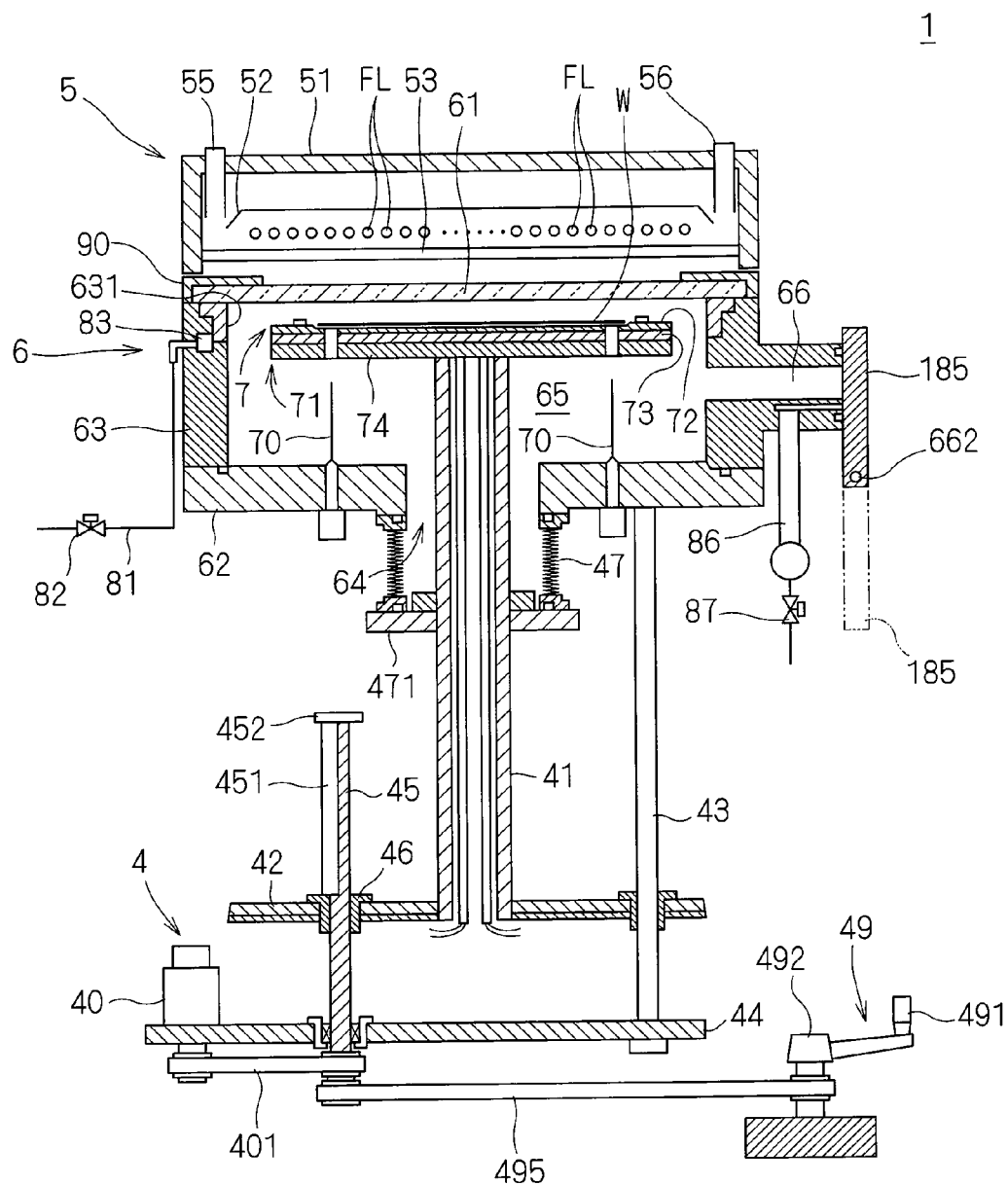
FIG. 5 is another longitudinal cross-sectional view of the configuration of the heat treatment apparatus in FIG. 1.

Hereinafter, preferred embodiments of the present invention will be described in detail with reference to the drawings.

(First Preferred Embodiment)

First, an example of a heat treatment apparatus suitable for performing a heat treatment method according to the present invention is outlined. FIG. 1 is a longitudinal cross-sectional view illustrating a configuration of a heat treatment apparatus 1 suitable for performing the heat treatment method according to the present invention. The heat treatment apparatus 1 is a flash lamp annealer for irradiating a generally disc-shaped semiconductor wafer W serving as a substrate with light from flash lamps so as to heat the semiconductor wafer W.

The heat treatment apparatus 1 includes a generally cylindrical chamber 6 for receiving the semiconductor wafer W therein, and a lamp house 5 including a plurality of built-in flash lamps FL. The heat treatment apparatus 1 further includes a controller 3 for controlling each operating mechanism provided in the chamber 6 and in the lamp house 5 for the implementation of the heat treatment of the semiconductor wafer W.

The chamber 6 is provided below the lamp house 5 and includes a chamber side portion 63 having a generally cylindrical inner wall and a chamber bottom portion 62 covering the bottom of the chamber side portion 63. A space surrounded by the chamber side portion 63 and the chamber bottom portion 62 is defined as a heat treatment space 65. Above the heat treatment space 65 is a top opening 60 equipped with and blocked by a chamber window 61.

The chamber window 61 forming the ceiling of the chamber 6 is a disk-shaped member made of quartz and serves as a quartz window that transmits light emitted from the lamp house 5 into the heat treatment space 65. The chamber bottom portion 62 and the chamber side portion 63, which form the main body of the chamber 6, are made of, for example, a metal material such as stainless steel with high strength and high heat resistance, and an upper ring 631 on the inner side surface of the chamber side portion 63 is made of an aluminum (Al) alloy or the like with greater durability against degradation due to light-irradiation compared with stainless steel.

In order to keep the hermetic state of the heat treatment space 65, the chamber window 61 and the chamber side portion 63 are sealed with an O-ring. To be more specific, the O-ring is inserted between an underside peripheral portion of the chamber window 61 and the chamber side portion 63, and a clamp ring 90 is provided to abut against an upper-side peripheral portion of the chamber window 61 and to be screwed to the chamber side portion 63, thereby forcing the chamber window 61 onto the O-ring.

The chamber bottom portion 62 has a plurality of (three, in the present preferred embodiment) support pins 70 extending upright therefrom through a holder 7 in order to support the semiconductor wafer W from the underside (surface opposite to the surface receiving light from the lamp house 5) thereof. The support pins 70 are made of, for example, quartz and can be replaced easily because they are secured from outside the chamber 6.

The chamber side portion 63 includes a transport opening 66 for the transport of the semiconductor wafer W. The transport opening 66 is openable and closable by a gate valve 185 that pivots about an axis 662. On the opposite side of the chamber side portion 63 from the transport opening 66, there is formed an inlet passage 81 which introduces a processing gas (e.g., an inert gas such as a nitrogen ($N_2$) gas, a helium (He) gas, or an argon (Ar) gas; or an oxygen ($O_2$) gas) into the heat treatment space 65. The inlet passage 81 has one end connected through a valve 82 to a gas supply mechanism (not shown) and the other end connected to a gas inlet buffer 83 formed inside the chamber side portion 63. The transport opening 66 has an outlet passage 86 formed to exhaust a gas within the heat treatment space 65 and connected through a valve 87 to an exhaust mechanism (not shown).

FIG. 2 is a cross-sectional view of the chamber 6 taken along a horizontal plane at the level of the gas inlet buffer 83. As illustrated in FIG. 2, the gas inlet buffer 83 is formed to extend over about one third of the inner periphery of the chamber side portion 63 on the opposite side from the transport opening 66 in FIG. 1, so that the processing gas introduced into the gas inlet buffer 83 through the inlet passage 81 is supplied through a plurality of gas supply holes 84 into the heat treatment space 65.

The heat treatment apparatus 1 further includes the generally disk-shaped holder 7 for holding the semiconductor wafer W in a horizontal position inside the chamber 6 and preheating the held semiconductor wafer W prior to light-irradiation, and a holder elevating mechanism 4 for moving the holder 7 vertically relative to the chamber bottom portion 62, which is the bottom of the chamber 6. The holder elevating mechanism 4 in FIG. 1 includes a generally cylindrical shaft 41, a movable plate 42, guide members 43 (in the present preferred embodiment, three guide members 43 are located around the shaft 41), a fixed plate 44, a ball screw 45, a nut 46, and a motor 40. The chamber bottom portion 62, which is the bottom of the chamber 6, has a generally circular lower opening 64 that has a smaller diameter than the holder 7. The shaft 41 of stainless steel is inserted into the lower opening 64 and is connected to the underside of the holder 7 (in the present preferred embodiment, a hot plate 71 of the holder 7) to support the holder 7.

The nut 46 in threaded engagement with the ball screw 45 is fixed to the movable plate 42. The movable plate 42 is movable in a vertical direction by being slidably guided by the guide members 43 that are fixed to and extend downwardly from the chamber bottom portion 62. The movable plate 42 is coupled to the holder 7 through the shaft 41.

The motor 40 is installed on the fixed plate 44 mounted to the lower ends of the guide members 43 and is connected to the ball screw 45 via a timing belt 401. When the holder elevating mechanism 4 moves the holder 7 vertically, the motor 40 serving as a driver rotates the ball screw 45 under the control of the controller 3 so that the movable plate 42 fixed to the nut 46 is moved along the guide members 43 in a vertical direction. The result is that the shaft 41 fixed to the movable plate 42 is moved in a vertical direction so that the holder 7 connected to the shaft 41 is moved up and down smoothly between a transfer position for transfer of a semiconductor wafer W in FIG. 1 and a processing position for processing of the semiconductor wafer W in FIG. 5.

On the upper surface of the movable plate 42, a mechanical stopper 451 of a generally semi-cylindrical shape (shape formed by cutting a cylinder into half along its length) is vertically arranged along the ball screw 45. Even if any anomalies happen to cause the movable plate 42 to move up above a given upper limit, the top end of the mechanical stopper 451 strikes an end plate 452 provided at the end of the ball screw 45, preventing irregular upward movement of the movable plate 42. This prevents the holder 7 from being moved up above a given level under the chamber window 61, thus avoiding collision of the holder 7 with the chamber window 61.

The holder elevating mechanism 4 further includes a manual elevator 49 for manually moving the holder 7 up and down for maintenance of the interior of the chamber 6. The manual elevator 49 includes a handle 491 and a rotary shaft 492 and can move the holder 7 up and down by rotating the rotary shaft 492 with the handle 491, to thereby rotate the ball screw 45 connected to the rotary shaft 492 via a timing belt 495.

On the underside of the chamber bottom portion 62, expandable and contractible bellows 47 that extend downwardly around the shaft 41 are provided, with their upper ends connected to the underside of the chamber bottom portion 62. The lower ends of the bellows 47 are mounted to a bellows-lower-end plate 471. The bellows-lower-end plate 471 is screwed to the shaft 41 with a collar member 411. The bellows 47 contract when the holder elevating mechanism 4 moves the holder 7 upwardly relative to the chamber bottom portion 62, while they expand when the holder elevating mechanism 4 moves the holder 7 downwardly. The expansion and contraction of the bellows 47 allows the heat treatment space 65 to be kept air-tight even during the upward and downward movement of the holder 7.

FIG. 3 is a cross-sectional view of the structure of the holder 7. The holder 7 includes a hot plate (heating plate) 71 for preheating (what is called assisted heating) a semiconductor wafer W, and a susceptor 72 installed on the upper surface (surface where the holder 7 holds a semiconductor wafer W) of the hot plate 71. The underside of the holder 7 is, as described previously, connected to the shaft 41 for moving the holder 7 up and down. The susceptor 72 is made of quartz (or it may be of aluminum nitride (AlN) or the like) and has, on the upper surface thereof, pins 75 for preventing misalignment of a semiconductor wafer W. The susceptor 72 is provided on the hot plate 71, with its underside in face-to-face contact with the upper surface of the hot plate 71. The susceptor 72 is thus capable of diffusing and transmitting heat energy from the hot plate 71 to a semiconductor wafer W placed on its upper surface and is cleanable during maintenance by being removed from the hot plate 71.

The hot plate 71 includes an upper plate 73 and a lower plate 74, both made of stainless steel. Resistance heating wires 76, such as nichrome wires, for heating the hot plate 71 are installed between the upper and lower plates 73 and 74, and a space between the upper and lower plates 73 and 74 is filled and sealed with electrically conductive brazing nickel (Ni). The upper and lower plates 73 and 74 are brazed to each other at their ends.

FIG. 4 is a plan view of the hot plate 71. As illustrated in FIG. 4, the hot plate 71 has a disk-shaped zone 711 and a ring-shaped zone 712 that are concentrically arranged in the central portion of an area facing a semiconductor wafer W being held, and four zones 713 to 716 formed by dividing a generally ring-shaped area around the zone 712 into four equal sections in a circumferential direction. Each pair of adjacent zones has a slight gap formed therebetween. The hot plate 71 is further provided with three through holes 77 through which the support pins 70 are inserted and which are spaced apart from one another at intervals of 120° on the circumference of the gap between the zones 711 and 712.

In each of the six zones 711 to 716, the resistance heating wires 76 are installed independently of one another to circulate around each zone to form an individual heater, so that each zone is heated individually by its own built-in heater. A semiconductor wafer W held by the holder 7 is heated by those built-in heaters in the six zones 711 to 716. Each of the zones 711 to 716 has a sensor 710 for measuring the temperature of each zone with a thermocouple. Each sensor 710 is connected to the controller 3 through the inside of the generally cylindrical shaft 41.

In heating the hot plate 71, the controller 3 controls an amount of power supplied to the resistance heating wires 76 installed in each zone so that the temperature of each of the six zones 711 to 716 measured by the sensor 710 becomes a given preset temperature. The controller 3 uses proportional-integral-derivative (PID) control for the temperature control of each zone. In the hot plate 71, the temperature of each of the zones 711 to 716 is continuously measured until the heat treatment of a semiconductor wafer W is completed (or, when there are a plurality of semiconductor wafers W to be processed in succession, until the heat treatment of all the semiconductor wafers W is completed), and the amount of power supplied to the resistance heating wires 76 installed in each zone is controlled on an individual basis, i.e., the temperature of the heater built in each zone is controlled individually, so that the temperature of each zone is kept at a set temperature. The set temperature of each zone can be changed by only an individually determined offset value from a reference temperature.

The resistance heating wires 76 installed in each of the six zones 711 to 716 are connected to a power supply source (not shown) over a power line passing through the inside of the shaft 41. On the way from the power supply source to each zone, the power line from the power supply source is installed within a stainless tube filled with an insulator such as magnesia (magnesium oxide) so as to be electrically insulated from the other lines. The inside of the shaft 41 is open to the atmosphere.

The lamp house 5 includes, inside a casing 51, a light source including a plurality of (in the present preferred embodiment, 30) xenon flash lamps FL, and a reflector 52 provided to cover over the light source. The lamp house 5 also has a lamp-light radiating window 53 mounted to the bottom of the casing 51. The lamp-light radiating window 53 forming the floor portion of the lamp house 5 is a plate-like member made of quartz. The lamp house 5 is provided above the chamber 6 so that the lamp-light radiating window 53 is opposed to the chamber window 61. The lamp house 5 irradiates the semiconductor wafer W held by the holder 7 within the chamber 6 with light from the flash lamps FL through the lamp-light radiating window 53 and the chamber window 61, to thereby heat the semiconductor wafer W.

The plurality of flash lamps FL, each of which is a rod-shaped lamp having an elongated cylindrical shape, are arranged in a plane so as to be longitudinally parallel to one another along the main surface (i.e., in the horizontal direction) of a semiconductor wafer W held by the holder 7. The plane defined by the arrangement of the flash lamps FL is accordingly a horizontal plane.

Figure 6:
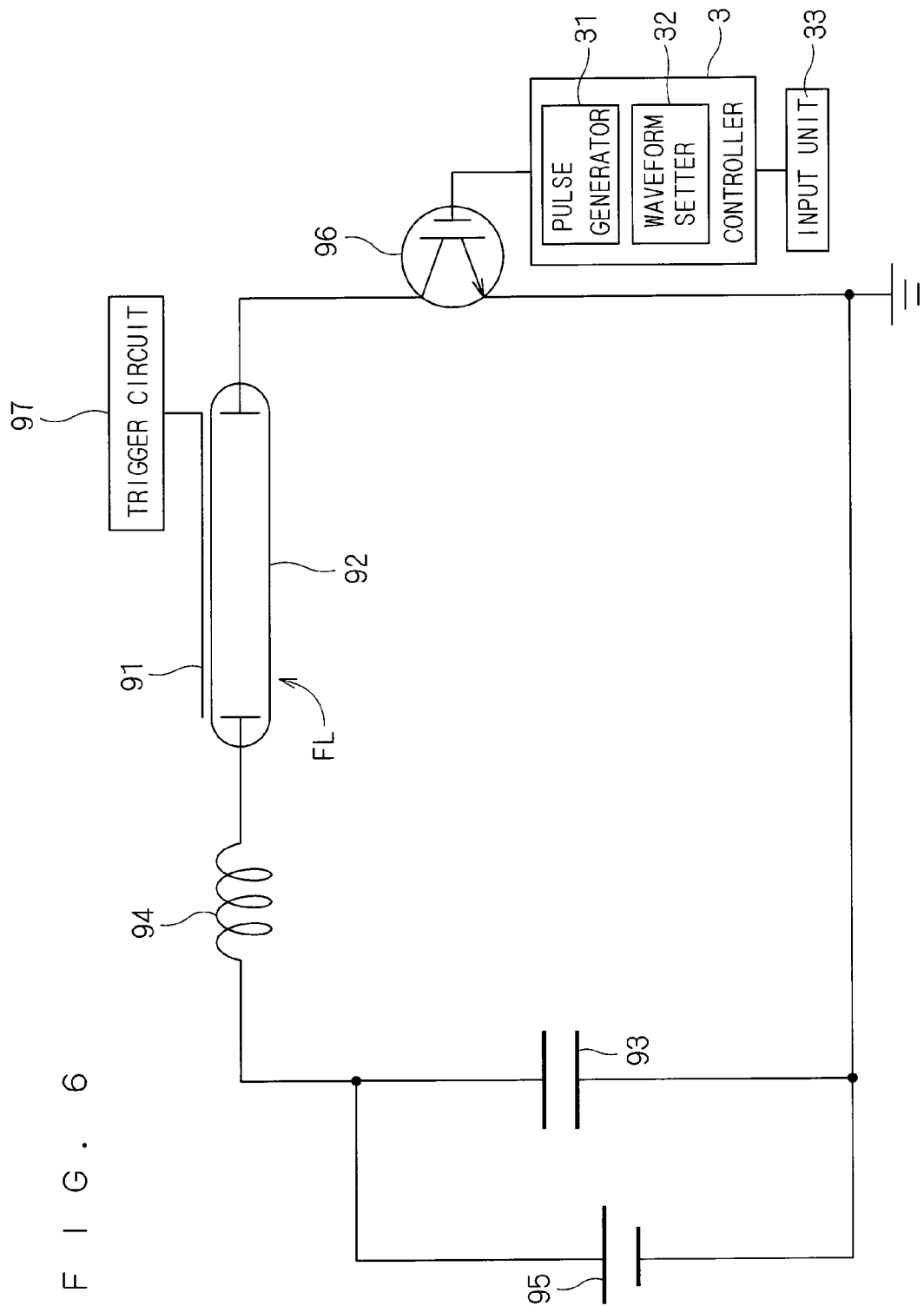
FIG. 6 illustrates a driving circuit for a flash lamp.

FIG. 6 illustrates a driving circuit for a flash lamp FL. As illustrated, a capacitor 93, a coil 94, a flash lamp FL, and a switching element 96 are connected in series. The flash lamp FL includes a rod-shaped glass tube (discharge tube) 92 containing a xenon gas sealed therein and having positive and negative electrodes provided on its opposite ends, and a trigger electrode 91 wound on the outer peripheral surface of the glass tube 92. Upon the application of a given voltage from a power supply unit 95, the capacitor 93 is charged in response to the applied voltage. A trigger circuit 97 is capable of applying voltage to the trigger electrode 91. The timing of the voltage application from the trigger circuit 97 to the trigger electrode 91 is under the control of the controller 3.

The present preferred embodiment employs an insulated gate bipolar transistor (IGBT) as the switching element 96. The IGBT is a bipolar transistor that incorporates a metal-oxide-semiconductor field effect transistor (MOSFET) into the gate and is also a switching element suitable for handling a large amount of power. The switching element 96 receives, at its gate, a pulse signal from a pulse generator 31 in the controller 3.

Even if, with the capacitor 93 in the charged state, a pulse is output to the gate of the switching element 96 and a high voltage is applied to the electrodes across the glass tube 92, no electricity will flow through the glass tube 92 in a normal state because the xenon gas is electrically insulative. However, if the application of voltage from the trigger circuit 97 to the trigger electrode 91 produces an electrical breakdown, discharge occurring across the electrodes causes a current to flow instantaneously into the glass tube 92, and the resultant excitation of xenon atoms or molecules induces light emission.

The reflector 52 in FIG. 1 is provided above the plurality of flash lamps FL to cover over all those flash lamps FL. A fundamental function of the reflector 52 is to reflect the light emitted from the plurality of flash lamps FL toward the holder 7. The reflector 52 is an aluminum alloy plate, and its surface (facing the flash lamps FL) is roughened by abrasive blasting to produce a satin finish thereon. Such surface roughing is required, because if the reflector 52 has a perfect mirror surface, the intensity of the reflected light from the plurality of flash lamps FL will exhibit a regular pattern, which may cause deterioration in the uniformity of the surface temperature distribution in the semiconductor wafer W.

The controller 3 controls the aforementioned various operating mechanisms provided in the heat treatment apparatus 1. The hardware configuration of the controller 3 is similar to that of a general computer. Specifically, the controller 3 includes a CPU for performing various computations, a ROM or read-only memory for storing basic programs therein, a RAM or readable/writable memory for storing various pieces of information therein, and a magnetic disk for storing control software, data, etc. therein. The controller 3 further includes the pulse generator 31 and a waveform setter 32 and is connected to an input unit 33. The input unit 33 may be any of various publicly-known input devices such as a keyboard, a mouse, and a touch panel. The waveform setter 32 sets the waveform of a pulse signal based on the input contents from the input unit 33, and the pulse generator 31 generates a pulse signal in accordance with that waveform.

The heat treatment apparatus 1 further includes, in addition to the above components, various cooling structures to prevent an excessive temperature rise in the chamber 6 and in the lamp house 5 due to heat energy generated by the flash lamps FL and the hot plate 71 during the heat treatment of a semiconductor wafer W. For instance, a water cooling tube (not shown) is provided in the chamber side portion 63 and the chamber bottom portion 62 of the chamber 6. The lamp house 5 forms an air cooling structure in which a gas supply pipe 55 and an exhaust pipe 56 are provided to form a gas flow therein and to exhaust heat (cf. FIGS. 1 and 5). Air is also supplied to a gap between the chamber window 61 and the lamp-light radiating window 53 to cool the lamp house 5 and the chamber window 61.

Figure 7:
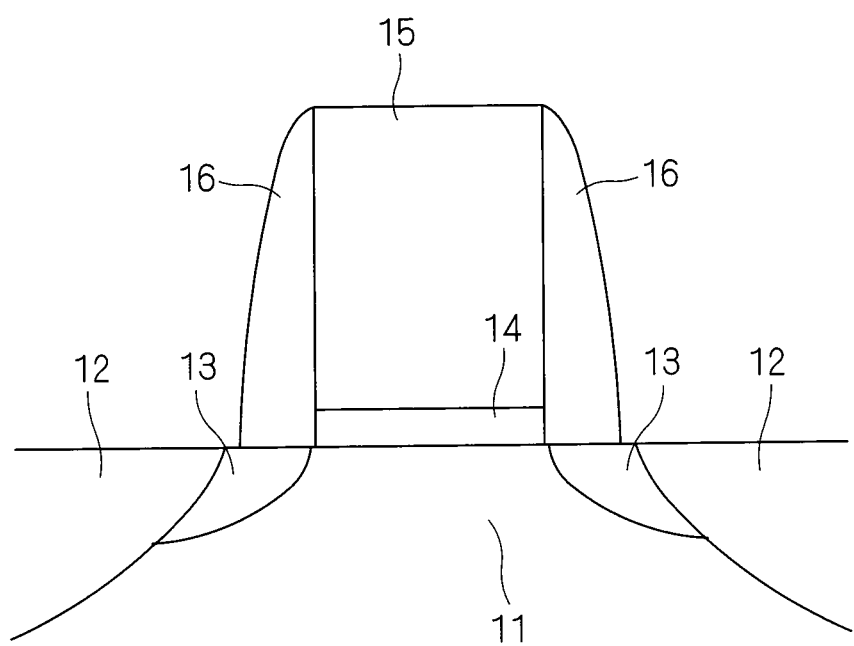
FIG. 7 illustrates a structure of semiconductor elements formed in or on a semiconductor wafer.
Figure 8:
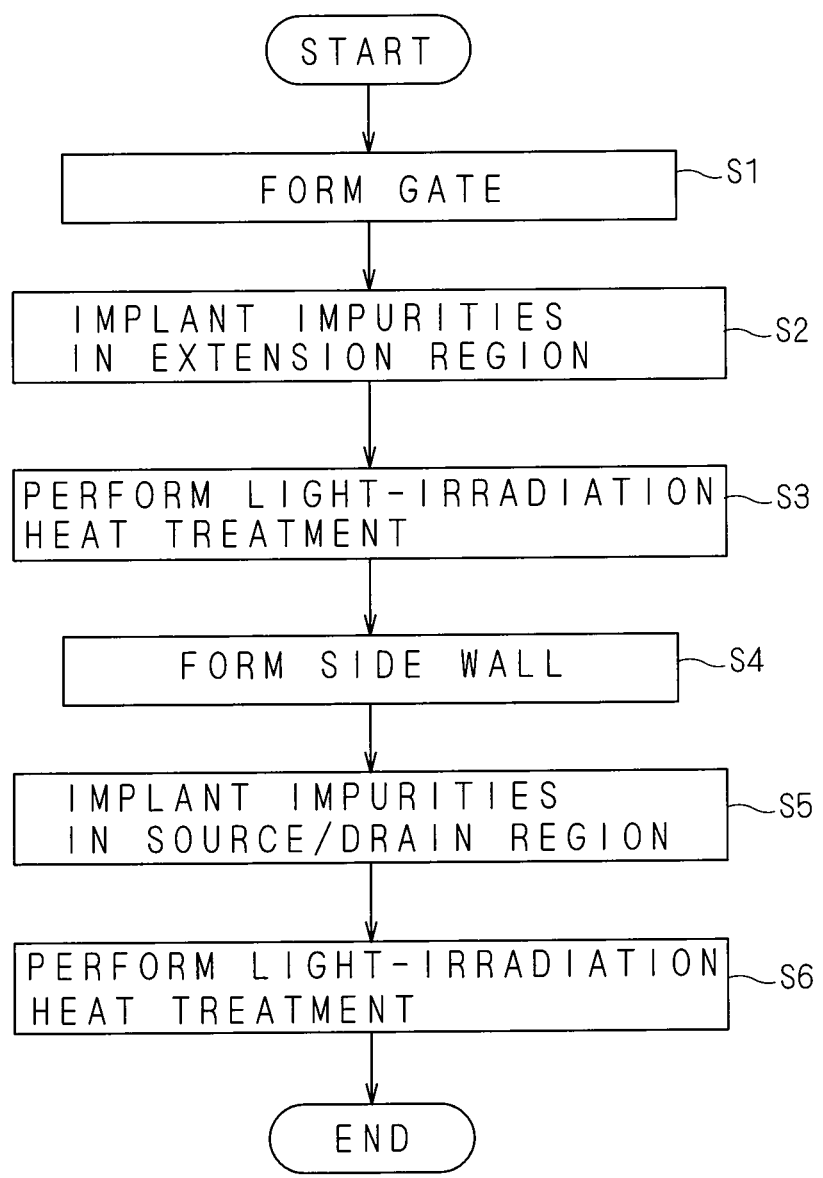
FIG. 8 is a flowchart showing an outline of a procedure for forming the elements in or on the semiconductor wafer.

Next, device formation in or on the semiconductor wafer W will be described. FIG. 7 illustrates a structure of semiconductor elements formed in or on the semiconductor wafer W. FIG. 8 is a flowchart showing an outline of a procedure for forming the elements in or on the semiconductor wafer. In the present preferred embodiment, a field effect transistor is formed as a semiconductor element in or on the semiconductor wafer W. First, a gate insulating film 14 and a gate electrode 15 are formed on a silicon substrate 11 (Step S1). The gate electrode 15 is a full metal gate formed of an alloy of magnesium (Mg), lanthanum (La) and hafnium (Hf). The gate electrode 15 may include at least one kind of metal selected from a group consisting of titanium (Ti), zirconium (Zr), hafnium (Hf), vanadium (V), niobium (Nb), tantalum (Ta), molybdenum (Mo) and tungsten (W). The gate insulating film 14 may be formed as a high-electric constant insulating film formed of a material having relative dielectric constant higher than that of, for example, a silicon oxide film, and includes at least one kind selected from a group consisting of hafnium (Hf), zirconium (Zr), aluminum (Al), yttrium (Y), lanthanum (La) and magnesium (Mg). Note that a side wall 16 is not formed in Step S1.

After the formation of the gate electrode 15, impurities (ion) are implanted in an extension region 13 of the silicon substrate 11 by ion implantation (Step S2). The extension region 13 is an electrically connection portion between the source/drain region 12 and a channel. Then, light-irradiation heat treatment (annealing) is performed, by the heat treatment apparatus 1, on a surface of the semiconductor wafer W including the extension region 13, to thereby perform activation of the implanted impurities (Step S3). The light-irradiation heat treatment by the heat treatment apparatus 1 will be described below.

After that, the side wall 16 of ceramic (in the preferred present embodiment, silicon nitride (SiN)) is formed on a side surface of the gate electrode 15 (Step S4). Subsequently, impurities are implanted in the source/drain region 12 of the silicon substrate 11 by ion implantation (Step S5). Then, light-irradiation heat treatment is performed again, by the heat treatment apparatus 1, on the surface of the semiconductor wafer W including the source/drain region 12, to thereby perform activation of the impurities implanted in the source/drain region 12 (Step S6). The light-irradiation heat treatment of Step S6 is the same as the treatment of Step S3.

Next, the light-irradiation heat treatment of the semiconductor wafer W by the heat treatment apparatus 1, which is performed in Step S3 and Step S6 of FIG. 8, is described in detail. The semiconductor wafer W in which impurities are implanted into the extension region 13 or the source/drain region 12 is to be processed, and activation of impurities thereof is performed through the light-irradiation heat treatment by the heat treatment apparatus 1. The procedure performed by the heat treatment apparatus 1, which will be described below, proceeds under the control of the controller 3 that controls each operating mechanism of the heat treatment apparatus 1.

First, the holder 7 is moved down from the processing position in FIG. 5 to the transfer position in FIG. 1. The "processing position" as used herein refers to the position of the holder 7 where the semiconductor wafer W is irradiated with light from the flash lamps FL, i.e., the position of the holder 7 within the chamber 6 in FIG. 5. The "transfer position" as used herein refers to the position of the holder 7 where the semiconductor wafer W is transported into and out of the chamber 6, i.e., the position of the holder 7 within the chamber 6 in FIG. 1. A reference position of the holder 7 in the heat treatment apparatus 1 is the processing position. Prior to processing, the holder 7 is in the processing position and, upon the start of processing, the holder 7 is moved down to the transfer position. When moved down to the transfer position as illustrated in FIG. 1, the holder 7 is brought into close proximity to the chamber bottom portion 62, so that the upper ends of the support pins 70 protrude through the holder 7 above the holder 7.

When the holder 7 is moved down to the transfer position, the valves 82 and 87 are opened to introduce a room-temperature nitrogen gas into the heat treatment space 65 of the chamber 6. Then, the gate valve 185 is opened to open the transport opening 66, whereby a semiconductor wafer W in which impurities are implanted is transported through the transport opening 66 into the chamber 6 and placed on the plurality of support pins 70 by a transport robot outside the apparatus.

The nitrogen gas supplied into the chamber 6 during the transport of the semiconductor wafer W is purged from the chamber 6 at a rate of about 40 L/min. The supplied nitrogen gas flows from the gas inlet buffer 83 in the direction of the arrows AR4 in FIG. 2 within the chamber 6 and is exhausted through the outlet passage 86 and the valve 87 in FIG. 1, using a utility exhaust system. Part of the nitrogen gas supplied into the chamber 6 is also exhausted from an exhaust port (not shown) provided inside the bellows 47. In each step described below, the nitrogen gas is continuously supplied into and exhausted from the chamber 6, and the amount of nitrogen gas supplied may vary widely in accordance with each step for processing the semiconductor wafer W.

After the transport of the semiconductor wafer W into the chamber 6, the transport opening 66 is closed with the gate valve 185. Then, the holder elevating mechanism 4 moves the holder 7 upwardly from the transfer position to the processing position, which is in close proximity to the chamber window 61. In the course of the upward movement of the holder 7 from the transfer position, the semiconductor wafer W is transferred from the support pins 70 to the susceptor 72 of the holder 7 and then placed and held on the upper surface of the susceptor 72. When the holder 7 is moved up to the processing position, the semiconductor wafer W held on the susceptor 72 is also held at the processing position.

Each of the six zones 711 to 716 of the hot plate 71 has been heated up to a given temperature by its own individually built-in heater (resistance heating wires 76) in each zone (between the upper plate 73 and the lower plate 74). By the holder 7 being moved up to the processing position and brought into contact with the semiconductor wafer W, the semiconductor wafer W is preheated by the heaters built in the hot plate 71 and its temperature rises gradually.

Figure 9:
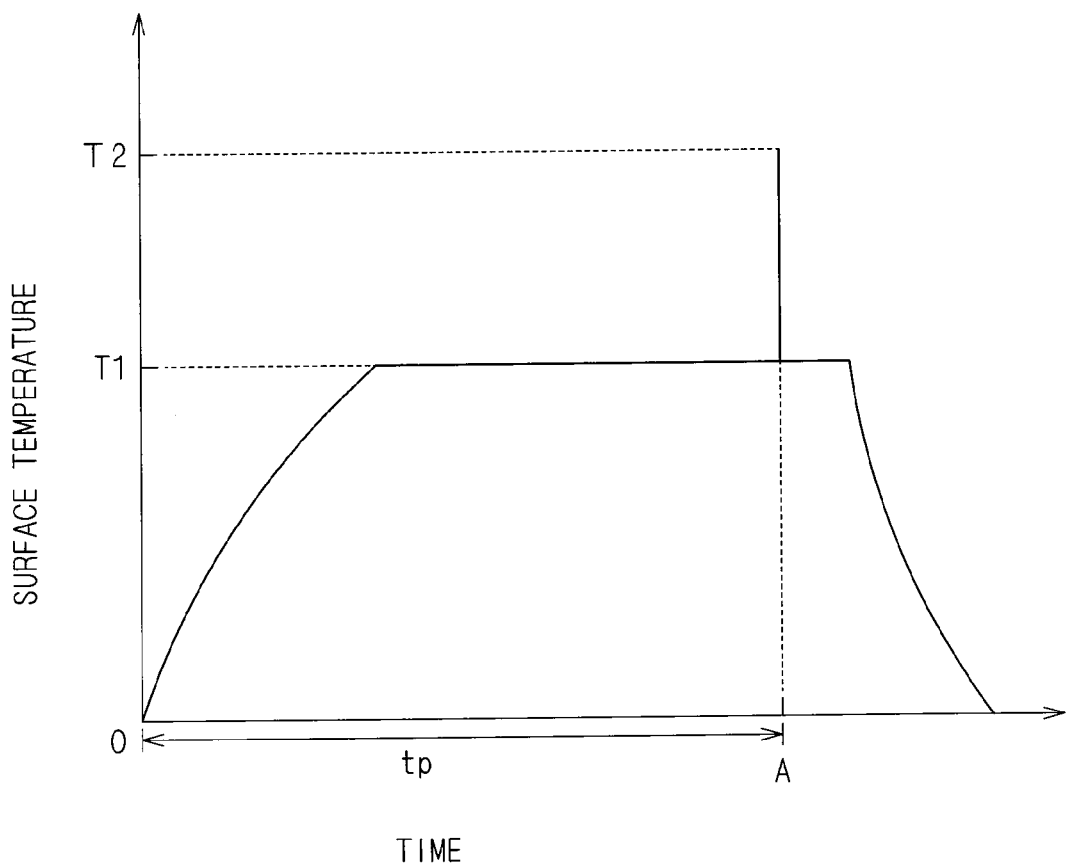
FIG. 9 shows changes in surface temperature of the semiconductor wafer from the start of preheating.

FIG. 9 shows changes in the surface temperature of a semiconductor wafer W from the start of preheating. Preheating for time tp at the processing position causes the temperature of a semiconductor wafer W to rise up to a preset preheating temperature T1. The preheating temperature T1 is of the order of 200 to 800° C., preferably of the order of 350 to 600° C. (in the present preferred embodiment, 600° C.) at which temperature there is no apprehension that impurities used in doping the semiconductor wafer W are heat diffused. The time tp for preheating the semiconductor wafer W ranges from about 3 to 200 seconds (in the present preferred embodiment, 60 seconds). The distance between the holder 7 and the chamber window 61 may be varied arbitrarily by controlling the amount of rotation of the motor 40 in the holder elevating mechanism 4.

After the lapse of the preheating time tp, light-irradiation heating of the semiconductor wafer W is started using the flash lamps FL at time A. For light-irradiation from the flash lamps FL, the capacitor 93 should be charged in advance by the power supply unit 95. Then, with the capacitor 93 in the charged state, a pulse signal is output from the pulse generator 31 in the controller 3 to the switching element 96.

Figure 10:
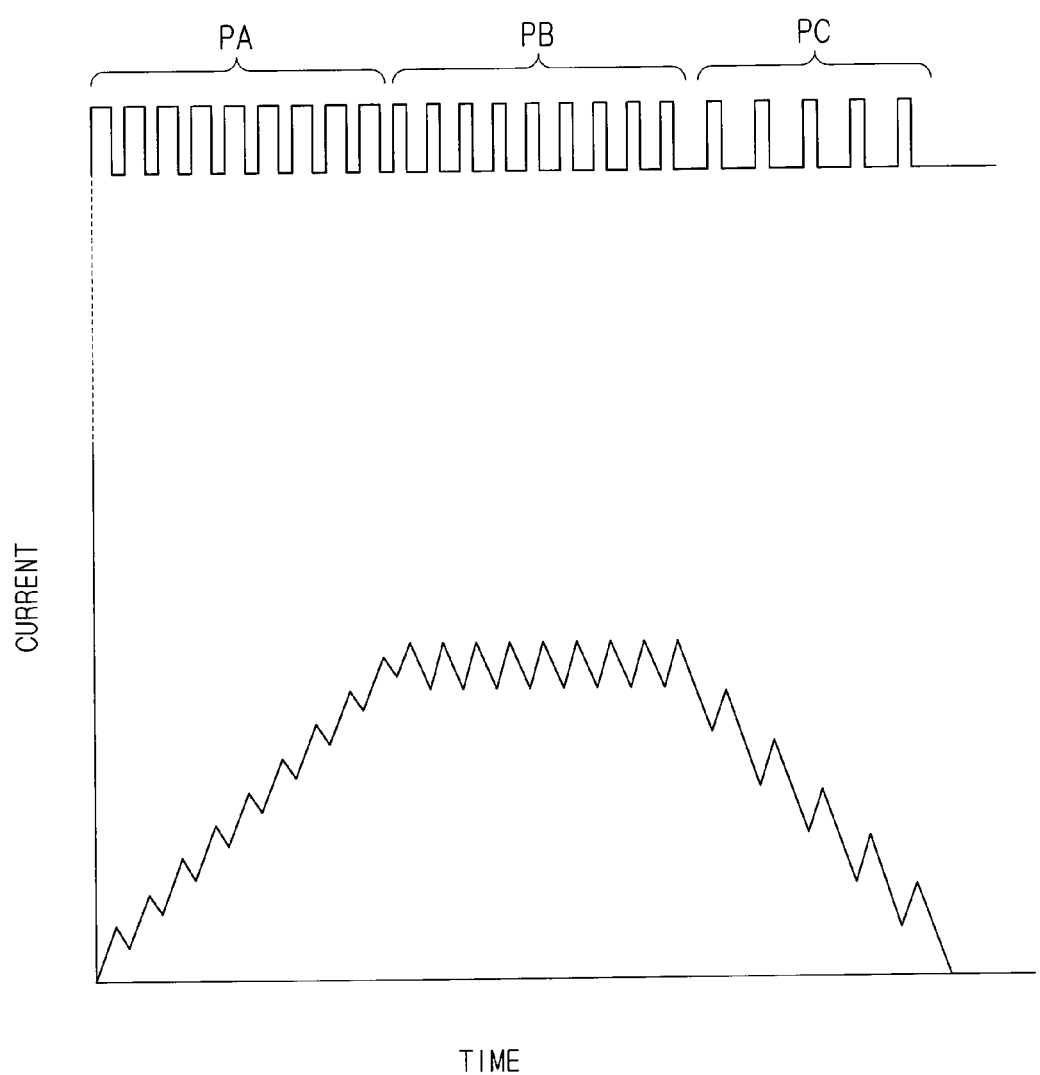
FIG. 10 shows an example of a correlation between a pulse signal waveform and a current flowing through a circuit.

FIG. 10 shows an example of the correlation between the waveform of a pulse signal and the current flowing through a circuit. In this case, a pulse signal having a waveform as shown in the upper part of FIG. 10 is output from the pulse generator 31. The pulse signal waveform can be defined by inputting a set of instructions that sequentially define a period of time (ON time) equivalent to the pulse width and a period of time (OFF time) between pulses, from the input unit 33. Upon operator input of such a set of instructions from the input unit 33 to the controller 3, the waveform setter 32 in the controller 3 sets a pulse waveform as shown in the upper part of FIG. 10. The pulse waveform shown in the upper part of FIG. 10 is set to include a plurality of pulses PA with relatively long width and short intervals, a plurality of pulses PB with shorter width and longer intervals than those of the plurality of pulses PA, and a plurality of pulses PC with intervals longer than those of the plurality of pulses PB, which are set in order. The pulse generator 31 then outputs a pulse signal in accordance with the pulse waveform that has been set by the waveform setter 32. As a result, a pulse signal having a waveform as shown in the upper part of FIG. 10 is applied to the gate of the switching element 96 so as to control on/off driving of the switching element 96.

In synchronization with the timing of the turning on of the pulse signal output from the pulse generator 31, the controller 3 causes the trigger circuit 97 to apply a voltage to the trigger electrode 91. Thus, when the pulse signal that has been input to the gate of the switching element 96 is ON, a current inevitably flows between the electrodes across the glass tube 92, and the resultant excitation of xenon atoms or molecules induces light emission. The controller 3 outputs a pulse signal having a waveform as shown in the upper part of FIG. 10 to the gate of the switching element 96 and a voltage is applied to the trigger electrode 91 in synchronization with the timing of the turning on of the pulse signal, which produces a flow of current having a waveform as shown in the lower part of FIG. 10 in the circuit including the flash lamp FL. In other words, the value of the current flowing through the glass tube 92 of the flash lamp FL increases when the pulse signal that has been input into the gate of the switching element 96 is ON, and the current value decreases when the pulse signal is OFF. Note that an individual current waveform corresponding to each pulse is defined by the constant of the coil 94.

The flow of a current having a waveform as shown in the lower part of FIG. 10 causes light emission from a flash lamp FL. The light-emission output of a flash lamp FL is almost proportional to the current flowing through the flash lamp FL. Thus, the output waveform of the light-emission output (light-emission output profile) of the flash lamp FL exhibits an approximately pattern as shown in FIG. 11. The light-irradiation to a surface of a semiconductor wafer W (which includes the source/drain region 12 and the extension region 13) held at the processing position by the holder 7 is performed in accordance with the output waveform of the flash lamps FL as shown in FIG. 11.

If, as in conventional cases, a flash lamp FL emits light without using the switching element 96, the charge stored in the capacitor 93 is consumed instantly by only one light emission. Accordingly, the flash lamp FL will produce a single-pulse output waveform having a width of approximately 0.1 to 10 milliseconds in such a manner that the pulse abruptly rises and also abruptly drops (light-emission output profile indicated by a broken line of FIG. 11).

On the other hand, if, as in the present preferred embodiment, the switching element 96 is connected in the circuit and a pulse signal as shown in the upper part of FIG. 10 is output to the gate of the switching element 96, the light emission from the flash lamp FL can be chopper-controlled in a manner, which allows the charge stored in the capacitor 93 to be divided for consumption, enabling the flash lamp FL to repeatedly flash within an extremely short period of time. Note that, as shown in the lower part of FIG. 10, the light-emission output never becomes exactly zero even while the flash lamp FL repeatedly flashes, because before the current value becomes exactly zero, the next pulse is applied to the gate of the switching element 96 to again increase the current value. Accordingly, from a macroscopic viewpoint, the light-emission output of the flash lamp FL produces the pattern as indicated by a solid line of FIG. 11 while repeating minor fluctuations.

The light-emission output profile indicated by the solid line of FIG. 11 can be regarded as executing three-step light-irradiation. Specifically, such three-step light-irradiation includes an output increasing step of increasing a light-emission output relatively gradually, a constant output irradiating step of keeping a roughly flat light-emission output thereafter, and an output attenuating step of attenuating the light-emission output relatively gradually after the constant output irradiating step.

To be more specific, first, the pulse generator 31 intermittently outputs a plurality of pulses PA with relatively long width and short intervals to the gate of the switching element 96, which causes the switching element 96 to repeatedly turn on and off so that a current having a sawtooth waveform in which a current value increases as a whole while repeating minor fluctuations flows through the circuit including the flash lamp FL. As a result, the light-emission output of the flash lamp FL increases from zero to a target value L1 as shown in FIG. 11. In the output increasing step, the light-emission output of the flash lamp FL is increased from zero to the target value L1 in this manner, and a light-irradiation time t1 thereof is between 1 and 100 milliseconds. That is, in the output increasing step, the light-emission output of the flash lamp FL is increased from zero to the target value L1 over a period of time from 1 to 100 milliseconds.

Then, the pulse generator 31 intermittently outputs a plurality of pulses PB with shorter width and longer intervals than those of the plurality of pulses PA to the gate of the switching element 96, which causes the switching element 96 to repeatedly turn on and off so that a current which has an almost constant average value and has a sawtooth waveform flows through the circuit including the flash lamp FL. This results in the flash lamp FL emitting light in accordance with a roughly flat output waveform in which the light-emission output falls within a fluctuation range of plus or minus 30% from the target value L1, as shown in FIG. 11. In the constant output irradiating step, the flash lamp FL emits light in accordance with the roughly flat output waveform, and a light-irradiation time t2 thereof is between 5 and 100 milliseconds. That is, in the constant output irradiating step, the light-emission output of the flash lamp FL is kept for 5 to 100 milliseconds within the fluctuation range of plus or minus 30% from the target value L1.

Then, the pulse generator 31 intermittently outputs a plurality of pulses PC with longer intervals than those of the plurality of pulses PB to the gate of the switching element 96, which causes the switching element 96 to repeatedly turn on and off so that a current which has a current value decreasing as a whole while repeating minor fluctuations and has a sawtooth waveform flows through the circuit including the flash lamp FL. As a result, as shown in FIG. 11, the light-emission output of the flash lamp FL is attenuated from the target value L1 to zero. In the output attenuating step, the light-emission output of the flash lamp FL is attenuated from the target value L1 to zero in this manner, and a light-irradiation time t3 thereof is between 1 and 100 milliseconds. That is, in the output attenuating step, the light-emission output of the flash lamp FL is attenuated from the target value L1 to zero over a period of time from 1 to 100 milliseconds. Note that in the present preferred embodiment, a total light-irradiation time of the flash lamp FL in one heating treatment, that is, a total of the light-irradiation time t1 in the output increasing step, the light-irradiation time t2 in the constant output irradiating step, and the light-irradiation time t3 in the output attenuating step is between 10 and 100 milliseconds.

Light-irradiation is performed from the flash lamp FL in accordance with the output waveform as shown in FIG. 11, whereby the surface temperature of the semiconductor wafer W gradually rises from the preheating temperature T1 to a target processing temperature T2, and then gradually drops. The surface temperature of the semiconductor wafer W changes gradually in this manner, which reduces damage thermally caused to the semiconductor wafer W to prevent the semiconductor wafer W from shattering. Further, the surface temperature of the semiconductor wafer W is raised to the target processing temperature T2, which enables sufficient activation of impurities implanted in the source/drain region 12 and/or the extension region 13 of the semiconductor wafer W. Further, a total heat amount of the surface of the semiconductor wafer W increases compared with conventional cases, which also advances recovery of defects introduced into the semiconductor wafer W in the ion implantation. Moreover, the surface temperature of the semiconductor wafer W gradually rises and then gradually drops, which prevents degradation of the gate electrode 15 made of metal. The processing temperature T2 is 1,000° C. or higher.

Although the surface temperature of the semiconductor wafer W gradually rises and then gradually drops, this holds true for the case to be compared with the conventional laser annealing or flash lamp annealing. The total light-emission time of the flash lamp FL is 1,000 milliseconds or less, and thus the temperature rises and drops in a remarkably shorter period of time compared with the light-irradiation heating using a halogen lamp or the like.

After the completion of the light-irradiation heating with the flash lamp FL and after approximately a 10-second standby at the processing position, the holder elevating mechanism 4 moves the holder 7 again down to the transfer position illustrated in FIG. 1, at which position the semiconductor wafer W is transferred from the holder 7 to the support pins 70. Then, the transport opening 66, which has been closed by the gate valve 185, is opened so that the semiconductor wafer W placed on the support pins 70 is transported out by the transport robot outside the apparatus. This completes the light-irradiation heat treatment of the semiconductor wafer W in the heat treatment apparatus 1.

As described previously, a nitrogen gas is continuously supplied into the chamber 6 during the heat treatment of the semiconductor wafer W in the heat treatment apparatus 1. The amount of that supply is approximately 30 liters per minute when the holder 7 is at the processing position, and approximately 40 liters per minute when the holder 7 is at any position other than the processing position.

In the present preferred embodiment, as indicated by the solid line of FIG. 11, the light-emission output of the flash lamp FL is increased up to the target value L1 over a period of time from 1 to 100 milliseconds, is next kept for 5 to 100 milliseconds within the fluctuation range of plus or minus 30% from the target value L1, and is then attenuated from the target value L1 to zero over a period of time from 1 to 100 milliseconds. That is, compared with the conventional flash lamp annealing indicated by the broken line of FIG. 11, the light-emission output of the flash lamp FL is increased more gradually, is kept to be constant for a certain period of time, and is then reduced more gradually. Accordingly, though the total heat amount of the surface of the semiconductor wafer W increases compared with the conventional cases, the surface temperature thereof rises more gradually and then drops more gradually compared with the conventional cases. This enables activation of implanted impurities and recovery of defects introduced in the ion implantation while reducing damage to the semiconductor wafer W.

Further, in the case where the extension region 13 and the source/drain region 12 are formed after the formation of the gate electrode 15 to perform the light-irradiation heat treatment with the flash lamp FL (in the case of a so-called gate-first process), as in the present preferred embodiment, it is also possible to prevent the gate electrode 15 from degrading.

While the first preferred embodiment of the present invention has been described above, numerous modifications and variations can be devised without departing from the scope of the invention. For example, the output waveform of the light-emission output of the flash lamp FL is not limited to that of the example in FIG. 11, but may be ones shown in FIGS. 12 to 15. Note that also in FIGS. 12 to 15, the light-emission output profile of the conventional single pulse is indicated by a broken line. Further, also in FIGS. 12 to 15, the total period of time for light-irradiation of the flash lamp FL in one heating treatment is between 10 and 1,000 milliseconds.

In the example shown in FIG. 12, the light-emission output of the flash lamp FL is increased up to the target value L1 at an increasing speed similar to that of the conventional case, and then the constant output irradiating step and the following output attenuating step, which are similar to those of the first preferred embodiment, are performed. Specifically, the pulse generator 31 outputs a single relatively long pulse in place of a plurality of pulses PA, and then outputs a plurality of pulses PB and a plurality of pulses PC similar to those of the upper part of FIG. 10 to the gate of the switching element 96. As a result, the light-emission output of the flash lamp FL is increased up to the target value L1, is kept for 5 to 100 milliseconds within the fluctuation range of plus or minus 30% from the target value L1, and is then attenuated from the target value L1 to zero over a period of time from 1 to 100 milliseconds.

If the light-irradiation heat treatment is performed with the flash lamp FL in accordance with the light-emission output profile shown in FIG. 12, the surface temperature of the semiconductor wafer W rises somewhat rapidly but drops gradually, which increases the total heat amount of the surface thereof compared with the conventional case, as in the first preferred embodiment. As a result, it is possible to achieve an effect almost similar to that of the preferred embodiment described above.

In the example shown in FIG. 13, the output increasing step and the following constant output irradiating step similar to those of the first preferred embodiment are performed, and then energization to the flash lamp FL is completely stopped to decrease the light-emission output to zero. Specifically, the pulse generator 31 outputs a plurality of pulses PA and a plurality of pulses PB which are similar to those of the upper part of FIG. 10 to the gate of the switching element 96, and then stops outputting the pulses. As a result, the light-emission output of the flash lamp FL is increased from zero up to the target value L1 over a period of time from 1 to 100 milliseconds, is subsequently kept for 5 to 100 milliseconds within the fluctuation range of plus or minus 30% from the target value L1, and is rapidly decreased to zero.

If the light-irradiation heat treatment is performed with the flush lamp FL in accordance with the light-emission output profile shown in FIG. 13, the surface temperature of the semiconductor wafer W drops somewhat rapidly but rises gradually, which increases the total heat amount of the surface compared with the conventional case, as in the first preferred embodiment. As a result, it is possible to achieve an effect almost similar to that of the preferred embodiment described above.

Figure 14:
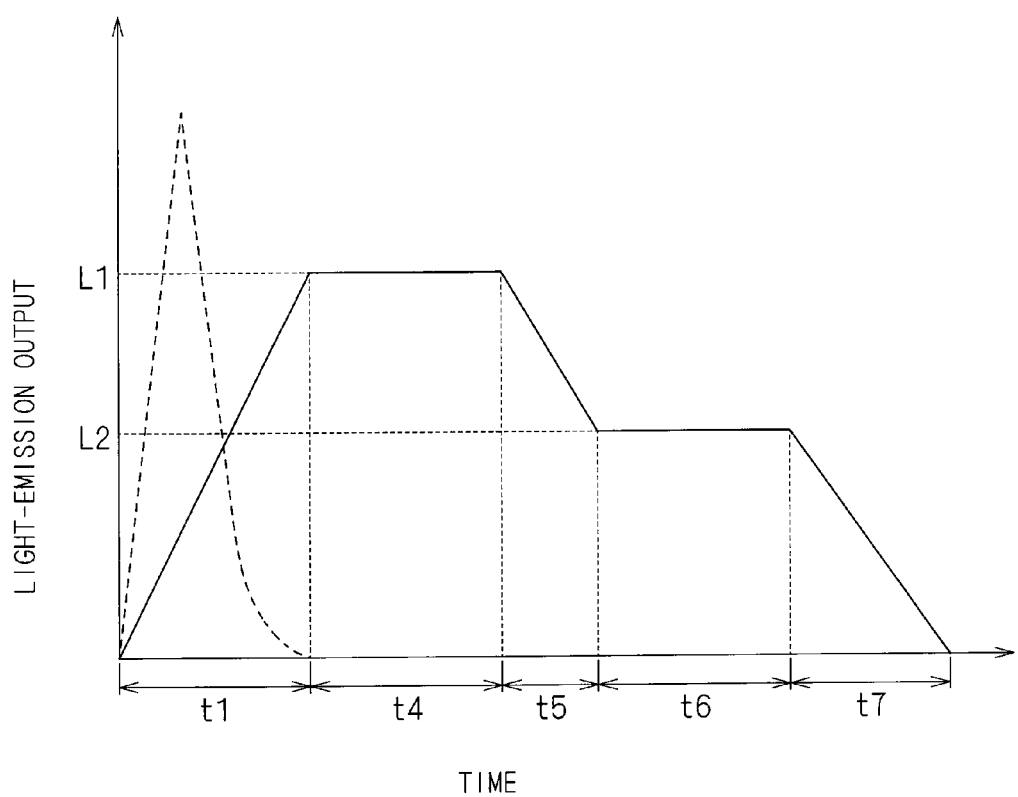
FIG. 14 shows another example of the profile of the light-emission output of the flash lamp.

In the example shown in FIG. 14, the output increasing step as in the first preferred embodiment is performed, and then the light-emission output of the flash lamp FL is decreased in two steps. Specifically, the pulse generator 31 first outputs a plurality of pulses PA similar to those of the upper part of FIG. 10 to the gate of the switching element 96 to perform the output increasing step in which the light-emission output of the flash lamp FL increases from zero up to the target value L1. The light-irradiation time t1 in the output increasing step falls within the range from 1 to 100 milliseconds. That is, in the output increasing step, the light-emission output of the flash lamp FL is increased from zero up to the target value L1 (first target value) over a period of time from 1 to 100 milliseconds.

Then, the pulse generator 31 intermittently outputs a plurality of pulses similar to those of a plurality of pulses PB of the upper part of FIG. 10, to thereby perform the first constant output irradiating step in which the flash lamp FL emits light in accordance with a roughly flat output waveform so that the light-emission output falls within the fluctuation range of plus or minus 30% from the target value L1. A light-irradiation time t4 in the first constant output irradiating step falls within a range from 5 to 100 milliseconds. That is, in the first constant output irradiating step, the light-emission output of the flash lamp FL is kept for 5 to 100 milliseconds within the fluctuation range of plus or minus 30% from the target value L1.

Next, the pulse generator 31 intermittently outputs a plurality of pulses similar to those of a plurality of pulses PC of the upper part of FIG. 10, to thereby perform the first output attenuating step in which the light-emission output of the flash lamp FL is attenuated from the target value L1 to a target value L2 (second target value). The target value L2 is smaller than the target value L1. A light-irradiation time t5 in the first output attenuating step falls within the range from 1 to 100 milliseconds. That is, in the first output attenuating step, the light-emission output of the flash lamp FL is attenuated from the target value L1 to the target value L2 over a period of time from 1 to 100 milliseconds.

Then, the pulse generator 31 intermittently outputs a plurality of pulses similar to those of a plurality of pulses PB of the upper part of FIG. 10, to thereby perform a second constant output irradiating step in which the flash lamp FL emits light in accordance with a roughly flat output waveform so that the light-emission output falls within the fluctuation range of plus or minus 30% from the target value L2. A light-irradiation time t6 in the second constant output irradiating step falls within the range from 5 to 100 milliseconds. That is, in the second constant output irradiating step, the light-emission output of the flash lamp FL is kept for 5 to 100 milliseconds within the fluctuation range of plus or minus 30% from the target value L2.

Then, the pulse generator 31 intermittently outputs a plurality of pulses similar to those of a plurality of pulses PC of the upper part of FIG. 10, to thereby perform a second output attenuating step in which the light-emission output of the flash lamp FL is attenuated from the target value L2 to zero. A light-irradiation time t7 in the second output attenuating step falls within the range from 1 to 100 milliseconds. That is, in the second output attenuating step, the light-emission output of the flash lamp FL is attenuated from the target value L2 to zero over a period of time from 1 to 100 milliseconds. Those respective steps are performed, so that the flash lamp FL emits light in accordance with the light-emission output profile as indicated by the solid line of FIG. 14.

Also if the light-irradiation heat treatment is performed with the flash lamp FL in accordance with the light-emission output profile shown in FIG. 14, the total heat amount of the surface of the semiconductor wafer W increases compared with the conventional case, but the surface temperature thereof rises more gradually and then drops more gradually compared with the conventional case. This enables the activation of implanted impurities and the recovery of defects introduced in ion implantation while reducing damage to the semiconductor wafer W.

Figure 15:
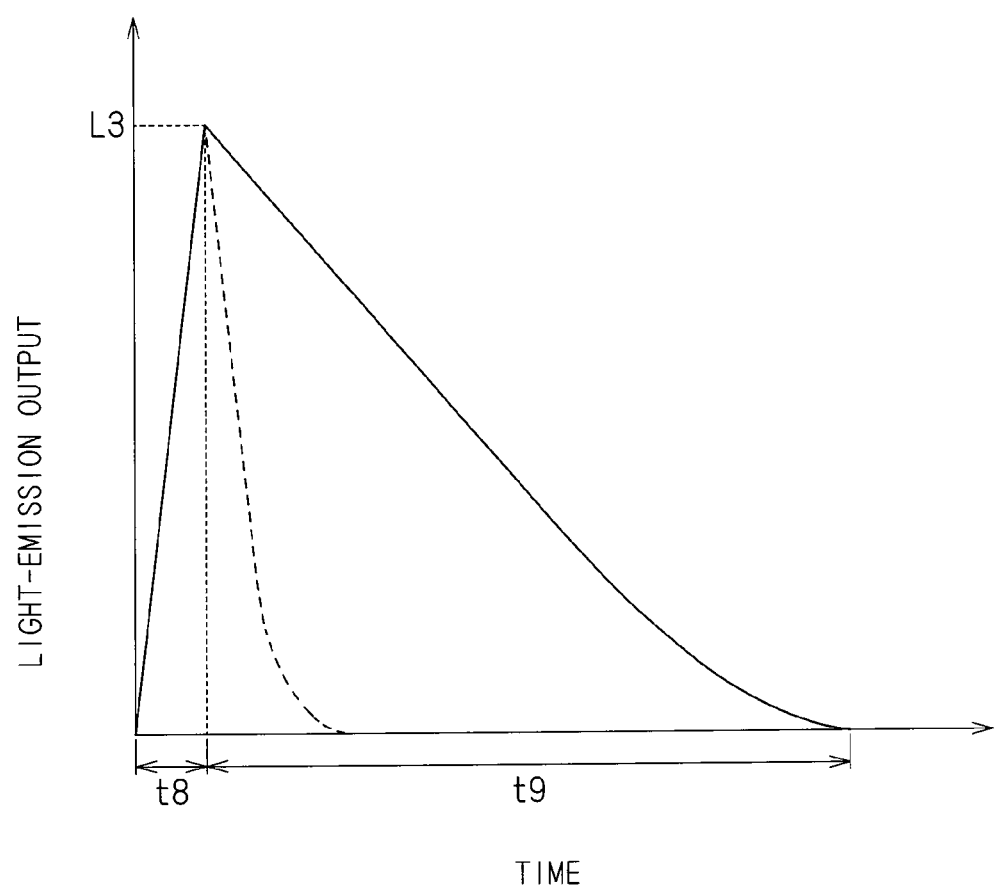
FIG. 15 shows another example of the profile of the light-emission output of the flash lamp.

Further, in the example shown in FIG. 15, the light-emission output of the flash lamp FL is increased up to a target value L3 at an increasing speed similar to that of the conventional case, and then the light-emission output of the flash lamp FL is reduced gradually. Specifically, the pulse generator 31 first outputs a single relatively long pulse to the gate of the switching element 96 in place of a plurality of pulses PA of the upper part of FIG. 10, to thereby perform the output increasing step in which the light-emission output of the flash lamp FL increases from zero up to the target value L3. The target value L3 is approximately equal to a peak value of the light-emission output with the conventional single-pulse. A light-irradiation time t8 in the output increasing step is 5 milliseconds or less. That is, in the output increasing step of FIG. 15, the light-emission output of the flash lamp FL is raised from zero up to the target value L3 in 5 milliseconds or less.

After that, the pulse generator 31 intermittently outputs a plurality of pulses similar to those of a plurality of pulses PC of the upper part of FIG. 10, to thereby perform the output attenuating step in which the light-emission output of the flash lamp FL is attenuated from the target value L3 to zero. A light-irradiation time t9 in the output attenuating step falls within the range from 1 to 100 milliseconds. That is, in the output attenuating step, the light-emission output of the flash lamp FL is attenuated from the target value L3 to zero over a period of time from 1 to 100 milliseconds. Those steps are performed, so that the flash lamp FL emits light in accordance with the light-emission output profile as indicated by a solid line of FIG. 15.

If the light-irradiation heat treatment is performed with the flash lamp FL in accordance with the light-emission output profile shown in FIG. 15, the surface temperature of the semiconductor wafer W rises rapidly but gradually drops, which increases the total heat amount of the surface thereof compared with the conventional case, as in the first preferred embodiment. As a result, it is possible to achieve an effect almost similar to that of the above-mentioned preferred embodiment.

The light-emission output profiles illustrated in FIGS. 11 to 15 may be used in accordance with a purpose of the light-irradiation heat treatment. In the light-emission output profiles (of FIGS. 11, 13 and 14) including a pattern in which the light-emission output increases gradually, the surface temperature of the semiconductor wafer W is raised gradually. Accordingly, the semiconductor wafer W is less damaged, which is effective in preventing the semiconductor wafer W from shattering. Further, the light-emission output profiles (of FIGS. 11, 12, 14 and 15) including the pattern in which the light-emission output drops gradually are effective in recovering defects. Further, the light-emission output profile shown in FIG. 11 is suitable for a case where the gate electrode 15 is made of metal, and the light-emission output profile shown in FIG. 15 is suitable for a case where the material of the gate electrode 15 is polysilicon.

Figure 16:
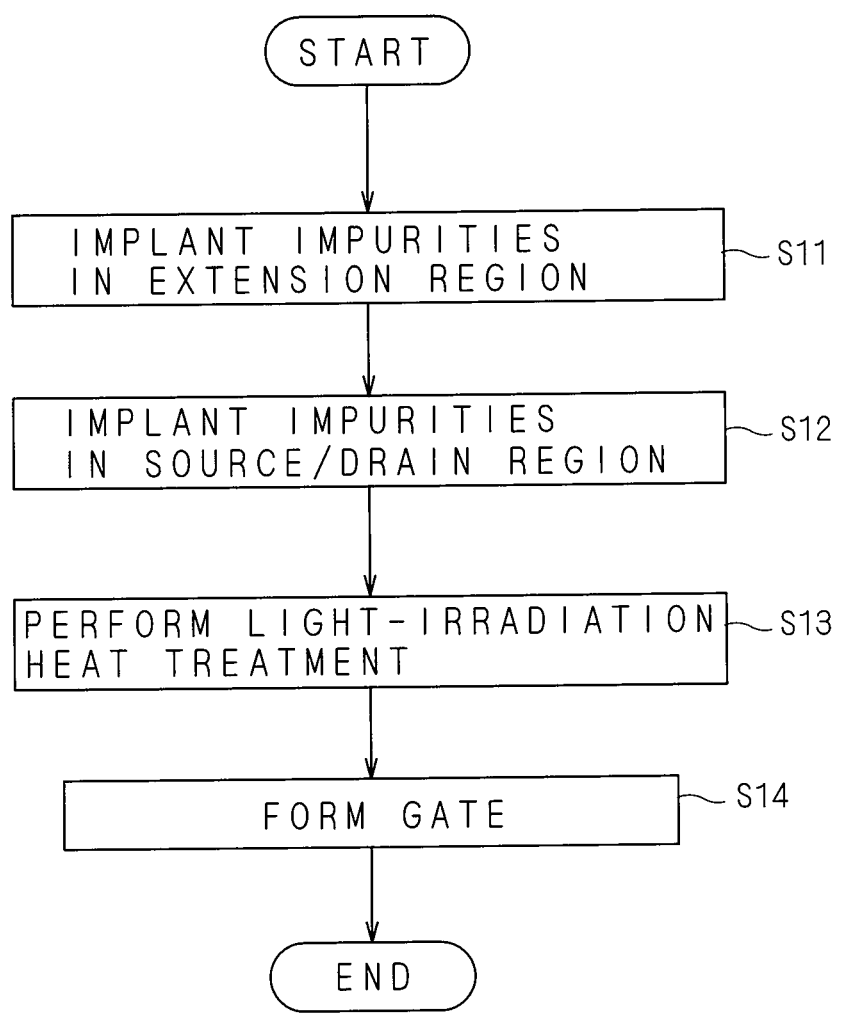
FIG. 16 is a flowchart showing another example of the procedure for forming the elements in or on the semiconductor wafer.

Further, while the source/drain region 12 is formed after the formation of the gate electrode 15 in the first preferred embodiment, the extension region 13 and the source/drain region 12 may be formed to be subjected to the light-irradiation heat treatment with the flash lamp FL, and then the gate electrode 15 may be formed (so-called gate-last process). FIG. 16 is a flowchart showing an outline of a procedure for forming elements in or on the semiconductor wafer W in the gate-last process.

In the procedure of FIG. 16, first, impurities are implanted in the extension region 13 of the silicon substrate 11 by ion implantation (Step S11). Then, impurities are implanted also in the source/drain region 12 of the silicon substrate 11 (Step S12). The gate electrode 15 has yet to be formed at this stage. Then, the light-irradiation heat treatment is performed, by the heat treatment apparatus 1, on the surface of the semiconductor wafer W including the extension region 13 and the source/drain region 12 in which impurities are implanted, to thereby activate the implanted impurities (Step S13). After the completion of the activation of the impurities, the gate electrode 15 is formed (Step S14). Even if the light-irradiation heat treatment (Step S13) in the gate-last process as described above is performed with the flush lamp FL in accordance with the light-emission output profile shown in FIG. 11, the total heat amount of the surface of the semiconductor wafer W increases compared with the convention case, but the surface temperature thereof rises more gradually and then drops more gradually compared with the conventional case. As a result, it is possible to activate the implanted impurities and recover defects introduced in the ion implantation while reducing damage to the semiconductor wafer W. Note that the light-irradiation heat treatment of Step S13 may be performed in accordance with the light-emission output profiles as shown in FIGS. 12 to 15.

Further, a field effect transistor is formed on a semiconductor wafer W in the first preferred embodiment, which is not limited thereto. Also in a case of forming a semiconductor element such as other type of transistor, thyristor and diode, the light-irradiation heat treatment according to the present invention may be performed on the surface of the semiconductor wafer W to which impurities are implanted.

Further, a circuit configuration different from that of FIG. 6 may be employed as long as it is capable of performing light-irradiation in accordance with the light-emission output profiles shown in FIGS. 11 to 15. For example, a plurality of power supply circuits whose coil constants are different from each other may be connected to one flash lamp FL.

Moreover, in the first preferred embodiment, the light-irradiation heat treatment is performed by the heat treatment apparatus 1 including the flash lamps FL, which is not limited thereto. The light-irradiation heat treatment similar to that of the preferred embodiment described above may be performed by a laser annealing apparatus. That is, the light source is not limited to the flash lamp FL as long as it is capable of performing light-irradiation in accordance with the light-emission output profiles shown in FIGS. 11 to 15, and may be one capable of performing light-irradiation for 10 to 100 milliseconds. For example, a laser may be employed.

(Second Preferred Embodiment)

Next, a second preferred embodiment of the present invention will be described. A heat treatment apparatus according to the second preferred embodiment is identical in hardware configuration to that of the first preferred embodiment. As in the first preferred embodiment, the semiconductor wafer W in which impurities are implanted in the extension region 13 and the source/drain region 12 is a substrate to be processed, and the implanted impurities are activated through the light-irradiation heat treatment by the heat treatment apparatus 1.

The procedure for performing the light-irradiation heat treatment on a semiconductor wafer W by the heat treatment apparatus according to the second preferred embodiment is also generally the same as that of the first preferred embodiment. That is, as shown in FIG. 9, preheating for time tp is performed at the processing position, whereby the temperature of the semiconductor wafer W rises up to the preset preheating temperature T1. The preheating temperature T1 is of the order of 200 to 800° C., preferably of the order of 350 to 600° C. (in the second preferred embodiment, 600° C.) at which temperature there is no apprehension that impurities used in doping the semiconductor wafer W are heat diffused. The time tp for preheating the semiconductor wafer W ranges from about 3 to 200 seconds (in the second preferred embodiment, 60 seconds). After the lapse of the preheating time tp, light-irradiation heating of the semiconductor wafer W is started using the flash lamps FL at time A. The second preferred embodiment is different from the first preferred embodiment in light-emission output profile of the flash lamp FL in the light-irradiation heating.

Also in the second preferred embodiment, the capacitor 93 is charged in advance by the power supply unit 95 in performing light-irradiation with the flush lamp FL. Then, the pulse generator 31 of the controller 3 outputs a pulse signal to the switching element 96 with the capacitor 93 being charged.

Figure 17:
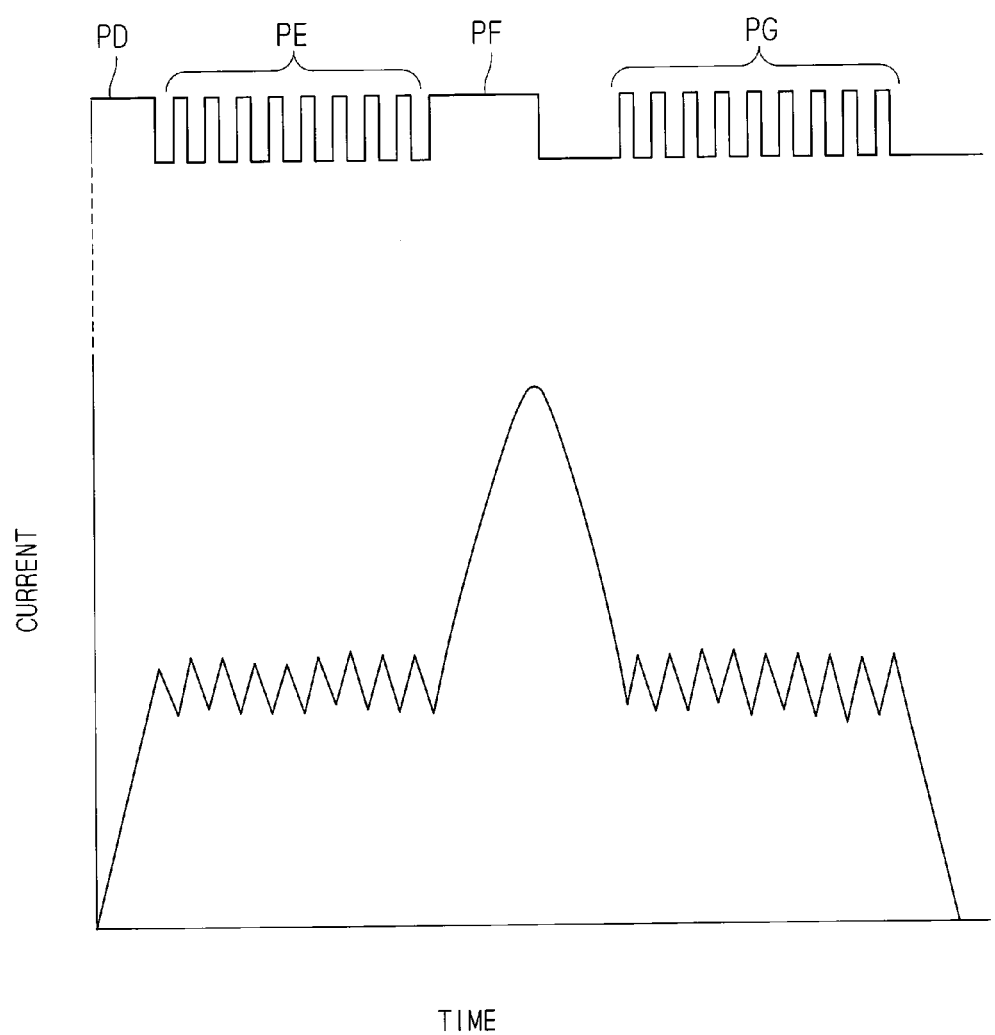
FIG. 17 shows another example of the correlation between the pulse signal waveform and the current flowing through the circuit.

FIG. 17 shows another example of the correlation between a pulse signal waveform and a current flowing through a circuit. In the second preferred embodiment, the pulse generator 31 outputs a pulse signal having a waveform as shown in the upper part of FIG. 17. The pulse signal waveform can be defined by inputting a set of instructions that sequentially define a period of time (ON time) equivalent to the pulse width and a period of time (OFF time) between pulses, from the input unit 33. Upon operator input of such a set of instructions from the input unit 33 to the controller 3, the waveform setter 32 in the controller 3 sets a pulse waveform as shown in the upper part of FIG. 17. The pulse waveform shown in the upper part of FIG. 17 includes a single relatively long pulse PD, a plurality of relatively short pulses PE, a single relatively long pulse PF, and a plurality of relatively short pulses PG, which are set in order. The pulse generator 31 then outputs a pulse signal in accordance with the pulse waveform that has been set by the waveform setter 32. As a result, a pulse signal having a waveform as shown in the upper part of FIG. 17 is applied to the gate of the switching element 96 so as to control on/off driving of the switching element 96.

In synchronization with the timing of the turning on of the pulse signal that has been output from the pulse generator 31, the controller 3 controls the trigger circuit 97 to apply a voltage to the trigger electrode 91. Thus, when the pulse signal that has been input to the gate of the switching element 96 is ON, a current inevitably flows between the electrodes across the glass tube 92, and the resultant excitation of xenon atoms or molecules induces light emission. The controller 3 outputs a pulse signal having a waveform as shown in the upper part of FIG. 17 to the gate of the switching element 96 and a voltage is applied to the trigger electrode 91 in synchronization with the timing of the turning on of the pulse signal, which produces a flow of current having a waveform as shown in the lower part of FIG. 17 in the circuit including the flash lamp FL. In other words, the value of the current flowing through the glass tube 92 of the flash lamp FL increases when the pulse signal that has been input to the gate of the switching element 96 is ON, and the current value decreases when the pulse signal is OFF. Note that an individual current waveform corresponding to each pulse is defined by the constant of the coil 94.

Figure 18:
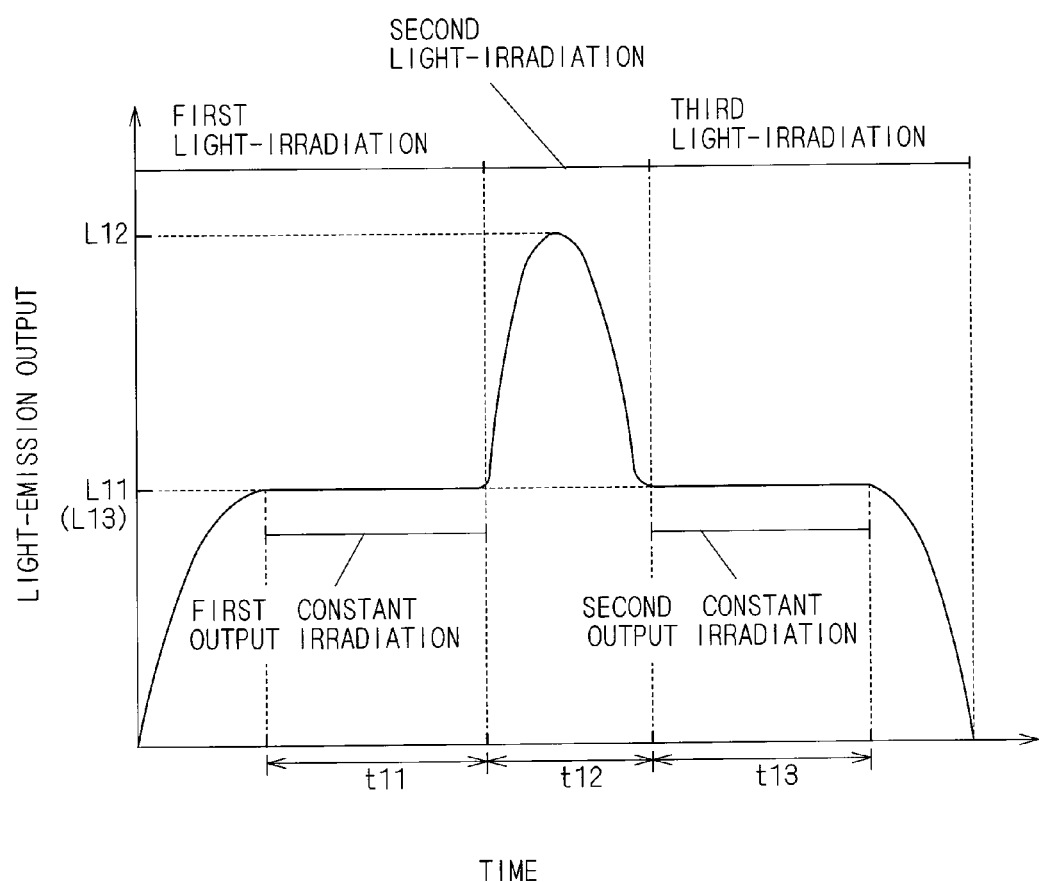
FIG. 18 shows another example of the profile of the light-emission output of the flash lamp.

The flow of current having a waveform as shown in the lower part of FIG. 17 causes light emission from a flash lamp FL. The light-emission output of a flash lamp FL is almost proportional to the current flowing through the flash lamp FL. Thus, the output waveform (profile) of the light-emission output of a flash lamp FL exhibits a pattern as shown in FIG. 18. The light-irradiation of a semiconductor wafer W held at the processing position by the holder 7 is performed in accordance with the output waveform of the flash lamps FL as shown in FIG. 18.

If, as in conventional cases, a flash lamp FL emits light without using the switching element 96, the charge stored in the capacitor 93 is consumed by only one instance of light emission, so that the flash lamp FL will produce a single-pulse output waveform having a width of approximately 0.1 to 10 milliseconds. On the other hand, if, as in the present preferred embodiment, the switching element 96 is connected in the circuit and a pulse signal as shown in the upper part of FIG. 17 is output to the gate of the switching element 96, the light emission from the flash lamp FL can be chopper-control in a manner, which allows the charge stored in the capacitor 93 to be divided for consumption, enabling the flash lamp FL to repeatedly flash within an extremely short period of time. Note that, as shown in FIG. 17, the light-emission output never becomes exactly zero even while the flash lamp FL repeatedly flashes, because before the current value becomes exactly zero, the next pulse is applied to the gate of the switching element 96 to again increase the current value.

The output waveform of light as shown in FIG. 17 can be regarded as executing three-step light-irradiation. Specifically, such three-step light-irradiation includes first light-irradiation in which light-irradiation of a semiconductor wafer W is performed in accordance with a relatively small and flat output waveform, second light-irradiation in which light-irradiation of the semiconductor wafer W is performed in accordance with a relatively high-peaked output waveform, and third light-irradiation in which additional light-irradiation of the semiconductor wafer W is performed again in accordance with a relatively small and flat output waveform after the peak.

To be more specific, as a first step, the pulse generator 31 outputs a relatively long pulse PD to the gate of the switching element 96, which causes the switching element 96 to be held in the ON state so that the current that flows through the circuit including the flash lamp FL, i.e., the light-emission output of the flash lamp FL, increases up to a target value L11. The pulse generator 31 then intermittently outputs a plurality of relatively short pulses PE to the gate of the switching element 96, which causes the switching element 96 to repeatedly turn on and off so that a current having a sawtooth waveform with an almost constant average value, which is as shown in the first section of the lower part of FIG. 17, flows through the circuit including the flash lamp FL. This results in the flash lamp FL emitting light in accordance with a generally flat output waveform that averages out at the light-emission output L11 (first light-emission output), as shown in the first section of FIG. 18. The first light-irradiation is one up to this stage. That is, the first light-irradiation includes irradiation in the course of the light-emission output of the flash lamp FL increasing up to the target value L11, and first constant output irradiation in which the average value is kept at the light-emission output L11.

The light-emission output in the first constant output irradiation averages out at the light-emission output L11 and falls within a fluctuation range of plus or minus 30% from the light-emission output L11. Further, a light-irradiation time t11 of the first constant output irradiation is between 5 and 100 milliseconds.

The pulse generator 31 then outputs a single relatively long pulse PF to the gate of the switching element 96, which causes the switching element 96 to be turned off after being held in a momentary ON state so that a current having a waveform that peaks as shown in the middle section of the lower part of FIG. 17 flows through the circuit including the flash lamp FL. This results in the flash lamp FL emitting light in accordance with an output waveform that peaks at a light-emission output L12 (second light-emission output) that is higher than the light-emission output L11 and the maximum value of the light-emission output in the first light-irradiation as shown in FIG. 18, which is the second light-irradiation of the semiconductor wafer W. A light-irradiation time t12 of the second light-irradiation is between 1 and 5 milliseconds.

Then, the pulse generator 31 intermittently outputs a plurality of relatively short pulses PG to the gate of the switching element 96 after the peak of the second light-irradiation, which causes the switching element 96 to repeatedly turn on and off so that a current having a sawtooth waveform whose average value is almost constant, which is as shown in the latter section of the lower part of FIG. 17, flows through the circuit including the flash lamp FL. This results in the flash lamp FL emitting light in accordance with an almost flat output waveform that averages out at a light-emission output L13 (third light-emission output), as shown in the latter section of FIG. 18. Then, the switching element 96 is held in the OFF state after the completion of output of the plurality of pulses PG, which decreases the light-emission output rapidly so that the flash lamp FL completely goes out. The third light-irradiation is irradiation performed until the flash lamp FL completely goes out after the peak. That is, the third light-irradiation includes second constant output irradiation in which the average value is kept at the light-emission output L13 and irradiation performed until the flash lamp FL completely goes out from the light-emission output L13.

The light-emission output in the second constant output irradiation averages out at the light-emission output L13 and falls within a fluctuation range of plus or minus 30% from the light-emission output L13. A light-irradiation time t13 in the second constant output irradiation is between 5 and 100 milliseconds. Note that in the present preferred embodiment, the light-emission output L13 in the third light-irradiation is equal to the light-emission output L11 in the first light-irradiation, and thus is lower than the light-emission output L12 in the second light-irradiation. Further, a total period of time consumed by only one instance of light emission of the flash lamp FL, that is, a total of the light-irradiation time in the first light-irradiation, the light-irradiation time in the second light-irradiation and the light-irradiation time in the third light-irradiation is 1 second or less.

The execution of the three-step light-irradiation as shown in FIG. 18 causes the surface temperature of the semiconductor wafer W to increase from the preheating temperature T1 up to the processing temperature T2 (cf. FIG. 9). More specifically, in the initial first light-irradiation, the first constant output light-irradiation of a semiconductor wafer W is performed with a light-emission output that averages out at the light-emission output L11 and that is kept for 5 to 100 milliseconds within a fluctuation range of plus or minus 30% from the light-emission output L11, which preheats the semiconductor wafer W so that the surface temperature of the semiconductor wafer W increases to some extent from the preheating temperature T1. This results in a reduction in the range of an instantaneous rise in the surface temperature in the subsequent second light-irradiation, thus reducing thermal damage to the semiconductor wafer W and preventing the semiconductor wafer W from shattering. Besides, efficiency of activating impurities in the second light-irradiation is promoted.

Then in the second light-irradiation, the light-irradiation of the semiconductor wafer W is performed in accordance with an output waveform that peaks at the light-emission output L12, which causes the surface temperature of the semiconductor wafer W to rise up to the target processing temperature T2. This allows the activation of the impurities implanted in the source/drain region 12 and the extension region 13 of the semiconductor wafer W. Note that the processing temperature T2 is 1,000° C. or higher.

In the subsequent third light-irradiation, the second constant output light-irradiation of the semiconductor wafer W is performed in accordance with an output waveform that averages out at the light-emission output L13 that is kept for 5 to 100 milliseconds within a fluctuation range of plus or minus 30% from the light-emission output L13, which allows the surface temperature of the semiconductor wafer W to drop from the processing temperature T2 over a certain period of time, instead of dropping rapidly. This facilitates the recovery of the defects introduced into the silicon substrate 11 in ion implantation.

After the completion of the third light-irradiation, the surface temperature of the semiconductor wafer W drops rapidly. Then, after the completion of the three-step light-irradiation heating with the flash lamps FL and after approximately a 10-second standby at the processing position, the holder elevating mechanism 4 moves the holder 7 down again to the transfer position in FIG. 1, at which position the semiconductor wafer W is transferred from the holder 7 to the support pins 70. Subsequently, the transport opening 66, which has been closed by the gate valve 185, is opened, so that the semiconductor wafer W placed on the support pins 70 is transported out by the transport robot outside the apparatus. This completes the light-irradiation heat treatment of the semiconductor wafer W in the heat treatment apparatus.

In the second preferred embodiment, light-irradiation is first performed for 5 to 100 milliseconds with an almost constant light-emission output L11 in the first light-irradiation, and then the second light-irradiation of the semiconductor wafer W is performed in accordance with an output waveform that peaks at the light-emission output L12 that is higher than the light-emission output L11. The second light-irradiation is performed in accordance with a waveform having a peak on the semiconductor wafer W that has been preheated to some extent by the first light-irradiation, which enables efficient activation of implanted impurities while reducing the range of an instantaneous increase in the surface temperature of the semiconductor wafer W to reduce damage to the semiconductor wafer W. As a result, compared with the case of the conventional single-pulse irradiation with flashes of light of the same amount of energy, the semiconductor wafer W shatters less frequently to reduce a sheet resistance value. Note that the sheet resistance value is a typical measure of the properties of ion-implanted semiconductor wafer W, and the sheet resistance value on the surface of the semiconductor wafer W decreases due to the activation of impurities. Therefore, it is generally regarded that impurity activation treatment is performed more sufficiently as the sheet resistance value decreases.

In addition, in the second preferred embodiment, the third light-irradiation including the second constant output irradiation in which light-irradiation is performed with the almost constant light-emission output L13 over a period of time from 5 to 100 milliseconds is performed after the second light-irradiation having a peak. The execution of such third light-irradiation reduces the surface temperature of the semiconductor wafer W over a certain period of time, which also enables the recovery of the defects introduced into the semiconductor wafer W in the ion implantation. That is, the execution of the three-step light-irradiation of the semiconductor wafer W as shown in FIG. 18 enables the activation of implanted impurities and the recovery of introduced defects while reducing damage to the semiconductor wafer W.

While the second preferred embodiment according to the present invention has been described so far, various modifications of the invention other than those described above are possible without departing from the scope and spirit of the invention. For example, the output waveform of the light-emission output of the flash lamp FL is not limited to the example of FIG. 18, and may be ones shown in FIGS. 19 to 21. The three-step light-irradiation is performed also in the example shown in FIG. 19. Among the three steps, the first light-irradiation in which light-irradiation of the semiconductor wafer W is performed in accordance with a relatively small and flat output waveform and the second light-irradiation in which light-irradiation of the semiconductor wafer W is performed in accordance with the relatively high-peaked output waveform are similar to those of FIG. 18. In the third light-irradiation in accordance with the output waveform of FIG. 19, additional light-irradiation of the semiconductor wafer W is performed while gradually reducing light-emission output after the peak of the second light-irradiation.

Specifically, the first light-irradiation and the second light-irradiation are performed by the pulse generator 31 outputting the pulse similar to that of the above-mentioned preferred embodiment to the gate of the switching element 96. After the peak of the second light-irradiation, the pulse generator 31 outputs, to the gate of the switching element 96, a plurality of pulses so as to gradually reduce the ON time and gradually increase the OFF time. This causes the switching element 96 to repeatedly turn on and off so that the ON time gradually reduces and the OFF time gradually increases, which gradually reduces the current flowing through the circuit including flash lamp FL. This results in the flash lamp FL emitting light in accordance with an output waveform so that the light-emission output gradually reduces, as shown in the latter section of FIG. 19. The light-irradiation time in the third light-irradiation is between 5 and 100 milliseconds. Note that a total of the light-irradiation time in the first light-irradiation, the light-irradiation time in the second light-irradiation and the light-irradiation time in the third light-irradiation is 1 second or less.

Figure 19:
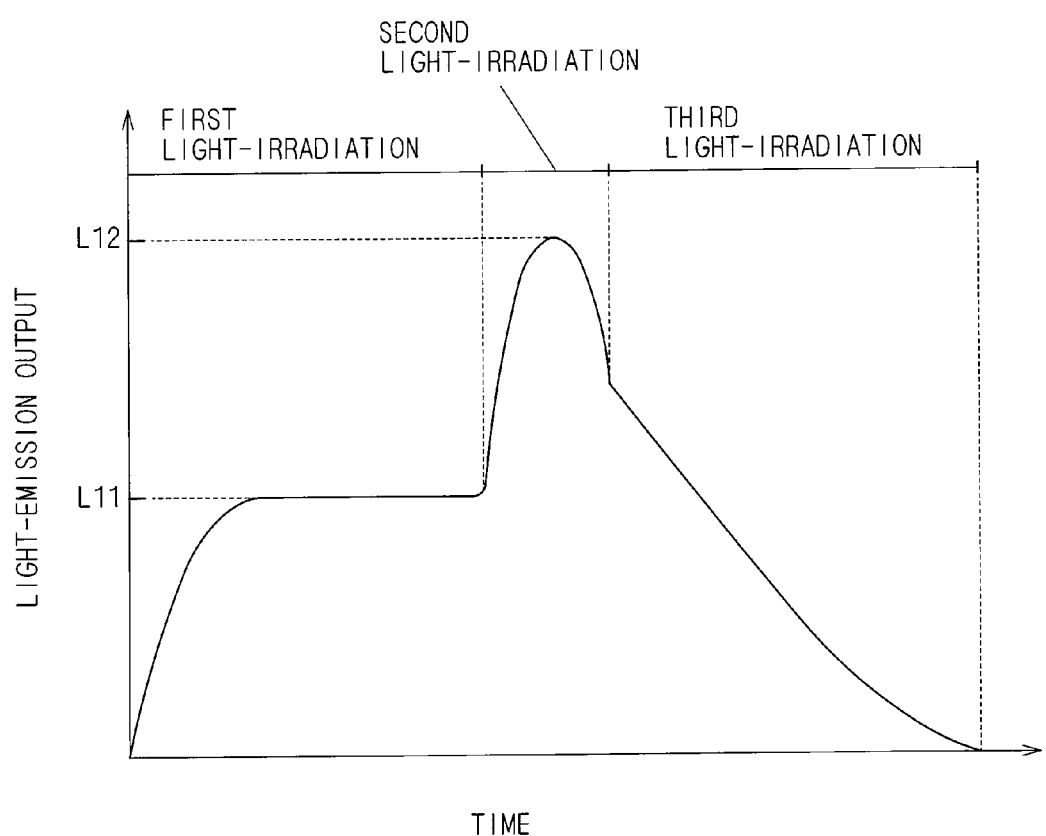
FIG. 19 shows another example of the profile of the light-emission output of the flash lamp.

Also if light-irradiation of the semiconductor wafer W is performed in accordance with the output waveform shown in FIG. 19, an effect similar to that of the second preferred embodiment can be achieved. That is, the first light-irradiation and the second light-irradiation enable efficient activation of the implanted impurities while reducing damage to the semiconductor wafer W. In addition, the light-irradiation is performed over a period of time from 5 to 100 milliseconds while gradually reducing the light-emission output in the third light-irradiation, which allows the surface temperature of the semiconductor wafer W to drop from the processing temperature T2 over a certain period of time, instead of dropping rapidly. This facilitates the recovery of the defects introduced into the semiconductor wafer W in the ion implantation.

Figure 20:
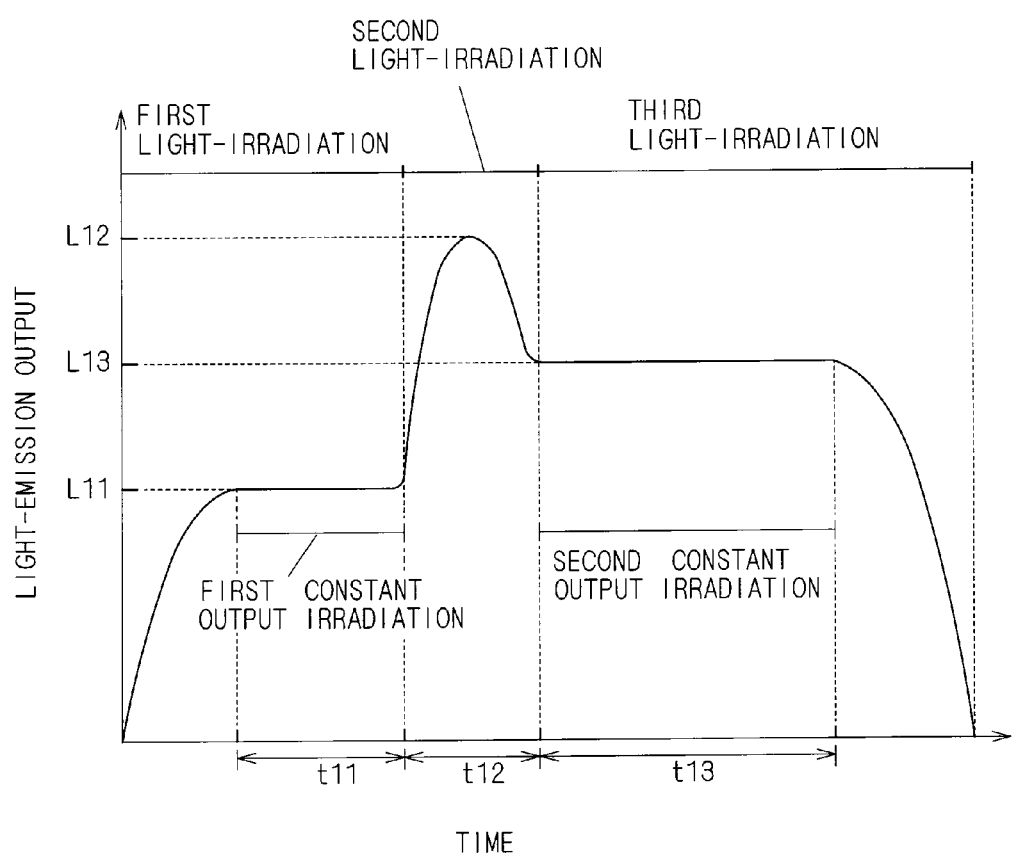
FIG. 20 shows another example of the profile of the light-emission output of the flash lamp.

The three-step light-irradiation is performed also in the example shown in FIG. 20. As in the second preferred embodiment, the three-step light-irradiation of FIG. 20 includes the first light-irradiation in which light-irradiation of a semiconductor wafer W is performed in accordance with a relatively small and flat output waveform, the second light-irradiation in which light-irradiation of the semiconductor wafer W is performed in accordance with a relatively high-peaked output waveform, and the third light-irradiation in which additional light-irradiation of the semiconductor wafer W is performed again in accordance with a relatively small and flat output waveform after the peak. In the output waveform of FIG. 20, the light-emission output L11 and the light-irradiation time t11 of the first constant output irradiation included in the first light-irradiation are different from the light-emission output L13 and the light-irradiation time t13 of the second constant output irradiation included in the third light-irradiation.

Specifically, in the example of FIG. 20, the light-emission output in the first constant output irradiation averages out at the light-emission output L11 and falls within a fluctuation range of plus or minus 30% from the light-emission output L11. On the other hand, the light-emission output in the second constant output irradiation averages out at the light-emission output L13 and falls within a fluctuation range of plus or minus 30% from the light-emission output L13. The light-emission output L13 in the second constant output irradiation is higher than the light-emission output L11 in the first constant output irradiation. Although the light-irradiation time t11 in the first constant output irradiation and the light-irradiation time t13 in the second constant output irradiation are both between 5 and 100 milliseconds, the light-irradiation time t13 in the second constant output irradiation is longer than the light-irradiation time t 11 in the first constant output irradiation. That is, light-irradiation is performed more intensely for a longer period of time in the second constant output irradiation than the first constant output irradiation. Note that a total of the light-irradiation time in the first light-irradiation, the light-irradiation time in the second light-irradiation, and the light-irradiation time in the third light-irradiation is 1 millisecond or less.

As in the second preferred embodiment, execution of the three-step light-irradiation of the semiconductor wafer W in accordance with the output waveform shown in FIG. 20 enables activation of the implanted impurities and recovery of the introduced defects while reducing damage to the semiconductor wafer W. The surface temperature of the semiconductor wafer W drops more slowly from the processing temperature T2 because light-irradiation is performed more intensely for a longer period of time in the second constant output irradiation than the first constant output irradiation, which is suitable for effectively performing defect recovery.

Figure 21:
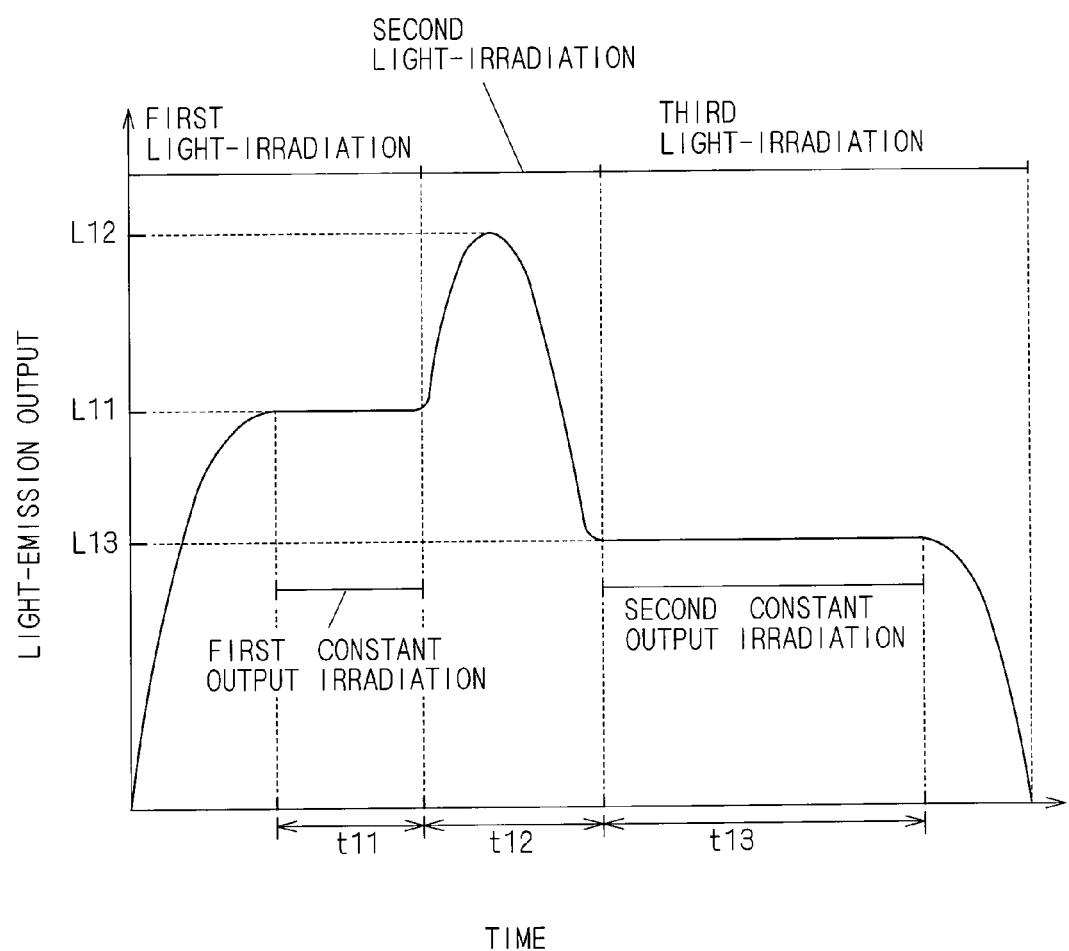
FIG. 21 shows another example of the profile of the light-emission output of the flash lamp.

The three-step light-irradiation is performed also in the example shown in FIG. 21. As in the second preferred embodiment, the three-step light-irradiation of FIG. 21 includes the first light-irradiation in which light-irradiation of a semiconductor wafer W is performed in accordance with a relatively small and flat output waveform, the second light-irradiation in which light-irradiation of the semiconductor wafer W is performed in accordance with a relatively high-peaked output waveform, and the third light-irradiation in which additional light-irradiation of the semiconductor wafer W is performed again in accordance with a relatively small and flat output waveform after the peak. In the output waveform of FIG. 21, the light-emission output L11 and the light-irradiation time t11 of the first constant output irradiation included in the first light-irradiation are different from the light-emission output L13 and the light-irradiation time t13 of the second constant output irradiation included in the third light-irradiation.

Specifically, in the example of FIG. 21, the light-emission output in the first constant output irradiation averages out at the light-emission output L11 and falls within a fluctuation range of plus or minus 30% from the light-emission output L11. On the other hand, the light-emission output in the second constant output irradiation averages out at the light-emission output L13 and falls within a fluctuation range of plus or minus 30% from the light-emission output L13. The light-emission output L13 in the second constant output irradiation is lower than the light-emission output L11 in the first constant output irradiation. Although the light-irradiation time t11 in the first constant output irradiation and the light-irradiation time t13 in the second constant output irradiation are both between 5 and 100 milliseconds, the light-irradiation time t13 in the second constant output irradiation is longer than the light-irradiation time t11 in the first constant output irradiation. That is, light-irradiation is performed more weakly for a longer period of time in the second constant output irradiation than the first constant output irradiation. Note that a total of the light-irradiation time in the first light-irradiation, the light-irradiation time in the second light-irradiation, and the light-irradiation time in the third light-irradiation is 1 millisecond or less.

As in the second preferred embodiment, execution of the three-step light-irradiation of the semiconductor wafer W in accordance with the output waveform shown in FIG. 21 also enables activation of the implanted impurities and recovery of the introduced defects while reducing damage to the semiconductor wafer W. The output waveform shown in FIG. 21 is suitable for promoting activation of the implanted impurities to reduce the sheet resistance value on the surface of the semiconductor wafer W.

In summary, a semiconductor wafer W should be subjected first to the first light-irradiation with the light-emission output L11 being as a target value, then to the second light-irradiation in accordance with an output waveform that peaks at the light-emission output L12 that is higher than the light-emission output L11 and the maximum value of the light-emission output in the first light-irradiation and, after the peak, to the additional third light-irradiation with a light-emission output lower than the light-emission output L12. Such three-step light-irradiation heat treatment enables activation of the implanted impurities and recovery of the introduced defects while reducing damage to the semiconductor wafer W.

A circuit configuration different from that of FIG. 6 may be employed as long as it is capable of performing the three-step light-irradiation. For example, three power supply circuits having coil constants different from each other may be connected to one flash lamp FL. Further, a light source is not limited to the flash lamp FL as long as the three-step light-irradiation is performed and also as long as light-irradiation is enabled within one second. For example, a laser may be employed.

(Variations)

While in each of the above-described preferred embodiments, a voltage is applied to the trigger electrodes 91 in synchronization with the timing of the turning on of a pulse signal, the timing of the trigger-voltage application is not limited thereto. A voltage may be applied at any fixed intervals irrespective of the pulse signal waveform. Moreover, if a pulse signal has a narrow space width so that the value of a current caused by a certain pulse to flow through a flash lamp FL is to still remain at a given value or more when the flash lamp FL is energized by the next pulse, current will continue to flow as is through the flash lamp FL, in which case it is not necessary to apply the trigger voltage for each pulse. If all the space widths of a pulse signal are narrow as in FIG. 10 according to the first preferred embodiment and FIG. 17 according to the second preferred embodiment, the trigger voltage may be applied only when the initial pulse is applied, which enables the following formation of the current waveforms as shown in FIGS. 10 and 17 only by outputting the next pulse signal to the gate of the switching element 96 without applying the trigger voltage. In other words, as long as current flows through a flash lamp FL when a pulse signal is turned on, the timing of the trigger-voltage application is arbitrary.

The means of setting a pulse signal waveform is not limited to inputting parameters, such as a pulse width, one by one from the input unit 33. For instance, an operator may directly and graphically input a waveform with the input unit 33, may read out a previously set waveform stored in a storage device such as a magnetic disk, or may download a waveform from outside the heat treatment apparatus 1.

In each of the above-described preferred embodiments, the lamp house 5 includes 30 flash lamps FL, but the invention is not limited thereto and the number of flash lamps FL is arbitrary. Moreover, the flash lamps FL are not limited to xenon flash lamps and may be krypton flash lamps.

In each of the above-described preferred embodiments, IGBTs are used as the switching elements 96, but the present invention is not limited thereto. For example, any transistor or device other than an IGBT may be employed as long as it is capable of turning a circuit on and off in accordance with the waveform of an input pulse signal. It is, however, preferable that an IGBT or a gate turn-off (GTO) thyristor that is suitable for handling a large amount of power should be used as a switching element 96 because light emission from a flash lamp FL consumes a considerably large amount of power.

A substrate to be processed by the heat treatment apparatus according to the present invention is not limited to a semiconductor wafer, but it may be, for example, a glass substrate for use in a liquid crystal display apparatus. Moreover, the technique according to the present invention may be applied to the connection of metal and silicon, or the crystallization of polysilicon.

While the invention has been described in detail, the foregoing description is in all aspects illustrative and not restrictive. It is therefore understood that numerous modifications and variations can be devised without departing from the scope of the invention.

What is claimed is:

1. A heat treatment apparatus for heating a substrate by irradiating the substrate with light, comprising:
    a holder that holds a substrate;
    a light-irradiation unit that irradiates the substrate held by said holder with light; and
    a light-emission control unit that controls a light-emission output of said light-irradiation unit,
    said light-emission control unit comprising a switching element connected in series with said light-irradiation unit, a coil and a capacitor, and a pulse generator for applying a pulse signal to a gate of said switching element,
    wherein said pulse generator is configured to apply a pulse signal to said switching element so that a total light-irradiation time is not more than one second and that said light-irradiation unit performs a first light-irradiation of the substrate with a first light-emission output being as a target value, then performs a second light-irradiation of the substrate in accordance with an output waveform that peaks at a second light-emission output that is higher than said first light-emission output and a maximum value of the light-emission output of said first light-irradiation, and further performs an additional third light-irradiation of the substrate, after said peak, with a light-emission output that is lower than said second light-emission output.

2. The heat treatment apparatus according to claim 1, wherein said pulse generator is configured to apply a pulse signal to said switching element so that said light-irradiation unit performs by said first light-irradiation a first constant output irradiation of keeping the light-emission output that averages out at said first light emission output for 5 to 100 milliseconds within a fluctuation range of plus or minus 30% from said first light-emission output.

3. The heat treatment apparatus according to claim 2, wherein a light-irradiation time of the second light-irradiation is between 1 and 5 milliseconds.

4. The heat treatment apparatus according to claim 3, wherein said pulse generator is configured to apply a pulse signal to said switching element so that said light-irradiation unit performs by said third light-irradiation a second constant output irradiation of keeping the light-emission output that averages out at a third light-emission output lower than said second light-emission output for 5 to 100 milliseconds within a fluctuation range of plus or minus 30% from said third light-emission output.

5. The heat treatment apparatus according to claim 4, wherein:
    said third light-emission output is higher than said first light-emission output; and
    a light-irradiation time of said third light-irradiation is longer than a light-irradiation time of said first light-irradiation.

6. The heat treatment apparatus according to claim 3, wherein said pulse generator is configured to apply a pulse signal to said switching element so that said light-irradiation unit performs by said third light-irradiation the light-irradiation for 5 to 100 milliseconds while gradually reducing the light-emission output.

7. The heat treatment apparatus according to claim 1, wherein said light-irradiation unit includes a flash lamp.

8. The heat treatment apparatus according to claim 1, wherein said switching element is an insulated gate bipolar transistor.

* * * * *